(12) United States Patent
Ryu et al.

(10) Patent No.: US 11,664,436 B2
(45) Date of Patent: May 30, 2023

(54) SEMICONDUCTOR DEVICES HAVING GATE RESISTORS WITH LOW VARIATION IN RESISTANCE VALUES

(71) Applicant: Wolfspeed, Inc., Durham, NC (US)

(72) Inventors: Sei-Hyung Ryu, Cary, NC (US); Thomas E. Harrington, III, Durham, NC (US)

(73) Assignee: Wolfspeed, Inc., Durham, NC (US)

( * ) Notice: Subject to any disclaimer, the term of this patent is extended or adjusted under 35 U.S.C. 154(b) by 39 days.

(21) Appl. No.: 17/188,329

(22) Filed: Mar. 1, 2021

(65) Prior Publication Data

US 2022/0278212 A1 Sep. 1, 2022

(51) Int. Cl.
*H01L 29/40* (2006.01)
*H01L 29/423* (2006.01)

(52) U.S. Cl.
CPC ........ *H01L 29/4238* (2013.01); *H01L 29/405* (2013.01)

(58) Field of Classification Search
CPC ... H01L 29/4238; H01L 29/40; H01L 29/405; H01L 29/1095; H01L 29/7397; H01L 29/7811; H01L 29/7813; H01L 29/7803; H01L 29/1608
USPC ........................................................ 257/364
See application file for complete search history.

(56) References Cited

U.S. PATENT DOCUMENTS

| | | | | |
|---|---|---|---|---|
| 5,563,439 A * | 10/1996 | Chung | ................ | H01L 23/4824 |
| | | | | 257/E29.136 |
| 5,726,474 A * | 3/1998 | Miller | .................. | H01L 29/435 |
| | | | | 257/536 |
| 5,844,272 A * | 12/1998 | Soderbarg | ......... | H01L 29/78624 |
| | | | | 257/E29.279 |
| 6,580,108 B1 * | 6/2003 | Utsumi | ............... | H01L 29/4238 |
| | | | | 257/E29.198 |
| 6,791,106 B2 * | 9/2004 | Ohuchi | ............... | H01L 21/2807 |
| | | | | 257/E29.152 |
| 8,314,462 B2 | 11/2012 | Hull et al. | | |
| 2007/0272984 A1 * | 11/2007 | Tsukamoto | ......... | H01L 29/4238 |
| | | | | 257/E29.136 |
| 2009/0184373 A1 * | 7/2009 | Kaindl | ............. | H01L 29/66712 |
| | | | | 257/E21.294 |

(Continued)

FOREIGN PATENT DOCUMENTS

| | | |
|---|---|---|
| EP | 2933840 A1 | 10/2015 |
| EP | 3076431 A1 | 10/2016 |
| JP | S6298670 A | 5/1987 |

OTHER PUBLICATIONS

"Notification of Transmittal of the International Search Report and the Written Opinion of the International Searching Authority, or the Declaration for corresponding International Application No. PCT/US2022/017239, dated May 10, 2022, (20 pages)".

*Primary Examiner* — Sheikh Maruf
(74) *Attorney, Agent, or Firm* — Myers Bigel, P.A.

(57) ABSTRACT

Power semiconductor devices include a semiconductor layer structure comprising an active area with a plurality of unit cell transistors and an inactive gate pad area, a gate resistor layer on an upper side of the semiconductor layer structure, an inner contact that is directly on the upper side of the gate resistor layer, and an outer contact that is directly on the upper side of the gate resistor layer. The outer contact encloses the inner contact within the inactive gate pad area of the semiconductor device.

24 Claims, 16 Drawing Sheets

(56) References Cited

U.S. PATENT DOCUMENTS

| | | | |
|---|---|---|---|
| 2011/0024834 A1* | 2/2011 | Hull | H01L 29/4983 |
| | | | 257/E29.256 |
| 2012/0205669 A1* | 8/2012 | Miura | H01L 29/42368 |
| | | | 257/77 |
| 2013/0009225 A1* | 1/2013 | Kocon | H01L 29/41741 |
| | | | 257/E27.06 |
| 2013/0020587 A1* | 1/2013 | Hino | H01L 29/1095 |
| | | | 257/77 |
| 2013/0240994 A1* | 9/2013 | Lee | H01L 21/76877 |
| | | | 257/E29.134 |
| 2017/0271497 A1* | 9/2017 | Fayed | H01L 23/4821 |
| 2018/0175062 A1* | 6/2018 | Nagao | H01L 27/11896 |
| 2019/0097043 A1* | 3/2019 | Tominaga | H01L 29/42376 |

* cited by examiner

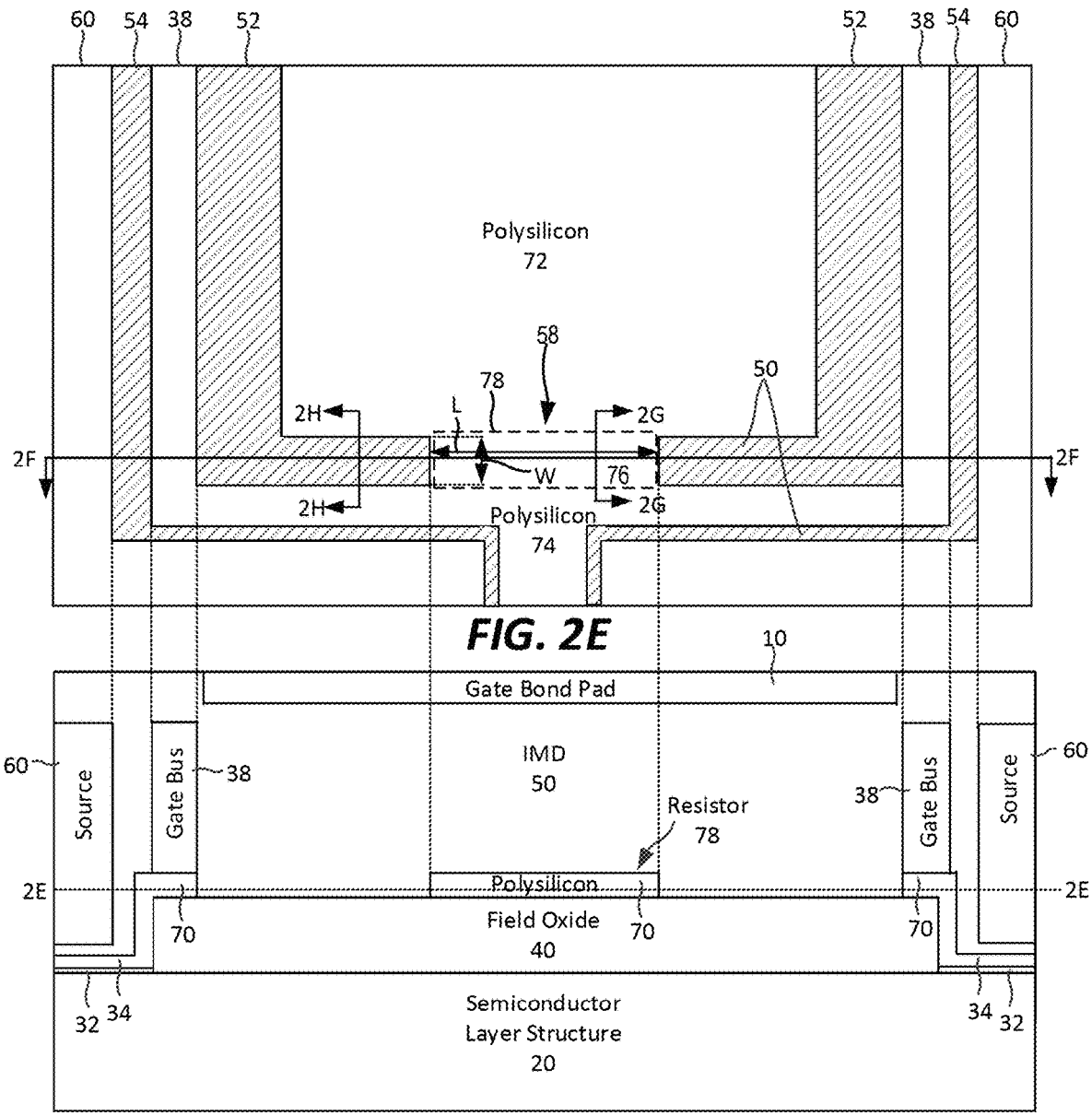

SEMICONDUCTOR DEVICES HAVING GATE RESISTORS WITH LOW VARIATION IN RESISTANCE VALUES

FIELD

The present invention relates to semiconductor devices and, more particularly, to semiconductor devices having gate resistors.

BACKGROUND

A wide variety of power semiconductor devices are known in the art including, for example, power Metal Oxide Semiconductor Field Effect Transistors ("MOSFETs"), Insulated Gate Bipolar Transistors ("IGBTs") and various other devices. These power semiconductor devices are generally fabricated from wide bandgap semiconductor materials such as silicon carbide or gallium nitride based materials (herein, the term "wide bandgap semiconductor" encompasses any semiconductor having a bandgap of at least 1.4 eV). Power semiconductor devices are designed to selectively block or pass large voltages and/or currents. For example, in the blocking state, a power semiconductor device may be designed to sustain hundreds or thousands of volts of electric potential.

Power semiconductor devices such as a power MOSFET can have a lateral structure or a vertical structure. A power MOSFET having a lateral structure has both the source region and the drain region of the MOSFET on the same major surface (i.e., upper or lower) of a semiconductor layer structure of the device. In contrast, a power MOSFET having a vertical structure has its source region on one major surface of the semiconductor layer structure and its drain region on the other (opposed) major surface thereof. Vertical device structures are typically used in very high power applications, as the vertical structure allows for a thick semiconductor drift layer that can support high current densities and block high voltages. Herein, the term "semiconductor layer structure" refers to a structure that includes one or more semiconductor layers such as semiconductor substrates and/or semiconductor epitaxial layers.

A conventional vertical silicon carbide power MOSFET includes a silicon carbide drift region that is formed on a silicon carbide substrate, such as a silicon carbide wafer. The MOSFET has an active region in which one or more semiconductor devices are formed, as well as one or more inactive regions such as a termination region that may surround the active region and/or a gate bond pad region. The active region acts as a main junction for blocking voltage during reverse bias operation and providing current flow during forward bias operation. The power MOSFET typically has a unit cell structure, meaning that the active region includes a large number of individual "unit cell" MOSFETs that are electrically connected in parallel to function as a single power MOSFET. In high power applications, such a device may include thousands or tens of thousands of unit cells.

Many power semiconductor devices, such as power MOSFETs and IGBTs, have gate structures. These devices can be turned on and off by applying different bias voltages to the gate structures thereof. The gate structure has a distributed gate resistance, which is a function of the length of the electrical path from the gate bond pad (or other gate terminal) to the gate finger of each individual unit cell and the sheet resistance of the materials forming the gate structure. The gate structure may comprise, for example, the gate bond pad, a plurality of gate fingers in the active region of the device, a gate pad, one or more gate buses that extend between the gate pad and the gate fingers, and optional gate runners that may be positioned between the gate bus(es) and the gate fingers. In many applications, it may be desirable to increase the amount of the gate resistance by, for example, adding a discrete or "lumped" gate resistor somewhere within the gate structure. The increased gate resistance may, for example, be used to limit the switching speed of the device or to reduce electrical ringing and/or noise.

SUMMARY

Pursuant to embodiments of the present invention, semiconductor devices are provided that include a semiconductor layer structure comprising an active area with a plurality of unit cell transistors and an inactive gate pad area, a gate resistor layer on an upper side of the semiconductor layer structure, an inner contact that is directly on the upper side of the gate resistor layer, and an outer contact that is directly on the upper side of the gate resistor layer. In a horizontal cross-section of these device the outer contact encloses the inner contact within the inactive gate pad area of the semiconductor device.

In some embodiments, these semiconductor devices may further include an inner dielectric pattern that is directly on the upper side of the gate resistor layer in between the inner contact and the outer contact.

In some embodiments, a lumped gate resistor may be defined in the gate resistor layer directly underneath the inner dielectric pattern.

In some embodiments, a horizontal cross-section of the lumped gate resistor may define at least a portion of an elliptical ring. In some embodiments, a horizontal cross-section of the inner dielectric pattern may have a shape of an elliptical ring.

In some embodiments, the gate resistor layer may comprise a first material that has a first sheet resistance and the inner contact and the outer contact may each comprise materials that have a sheet resistance that is less than the first sheet resistance.

In some embodiments, the gate structure may further include a gate pad, one or more gate buses and a plurality of gate fingers, and where the lumped gate resistor may be interposed electrically between the gate pad and the gate fingers.

In some embodiments, a separation between an outer sidewall of the inner contact and an inner sidewall of the outer contact may be a constant distance, while in other embodiments, this distance may be a variable distance.

In some embodiments, a shape of the inner dielectric pattern may define a shape of the lumped gate resistor.

In some embodiments, the inner contact may be configured to deliver a gate signal to a first edge of the lumped gate resistor and the outer contact may be configured to receive a gate signal from a second edge of the lumped gate resistor that is opposite the first edge.

In some embodiments, the outer contact may surround the inner contact or the outer contact and at least one edge of the semiconductor device may surround the inner contact.

Pursuant to further embodiments of the present invention, semiconductor devices are provided that include a semiconductor layer structure and a gate structure that includes a lumped gate resistor on an upper side of the semiconductor layer structure. A horizontal cross-section of the lumped gate resistor defines a closed shape.

In some embodiments, the closed shape may be an elliptical ring.

In some embodiments, the closed shape may be a first closed shape, and a dielectric pattern having a horizontal cross-section that defines a second closed shape may be positioned directly above the lumped gate resistor. In some embodiments, the second closed shape may be an elliptical ring.

In some embodiments, the dielectric pattern may be a first dielectric pattern and the gate structure may further comprise a second dielectric pattern and an inner contact, where the inner contact separates the first dielectric pattern from the second dielectric pattern.

In some embodiments, the gate structure may further comprise an outer contact that encloses the inner contact when the inner and outer contacts are viewed from above.

In some embodiments, the lumped gate resistor may comprise a first material that has a first sheet resistance and the inner contact and the outer contact may each comprise materials that have a sheet resistance that is less than the first sheet resistance.

In some embodiments, the closed shape may be an annular ring.

In some embodiments, a resistance value of the lumped gate resistor may be a function of a sheet resistance of a material of the lumped gate resistor and a separation between the first inner contact and the outer contact.

In some embodiments, the gate structure may further include a gate pad, one or more gate buses and a plurality of gate fingers, and the lumped gate resistor may be interposed electrically between the gate pad and the gate fingers.

In some embodiments, a separation between an inner edge of the closed shape and an outer edge of the closed shape may be a constant distance or a variable distance.

Pursuant to still further embodiments of the present invention, semiconductor devices are provided that include a gate structure that comprises a lumped gate resistor on an upper side of the semiconductor layer structure. A first end and an opposed second end of the lumped gate resistor each extend to a periphery of the semiconductor device.

In some embodiments, the first end may extend to a first edge of the semiconductor device and the second end may also extend to the first edge of the semiconductor device. In some embodiments, the first end may extend to a first edge of the semiconductor device and the second end may extend to a second edge of the semiconductor device, where the second edge may be adjacent the first edge.

In some embodiments, the lumped gate resistor may have a horizontal cross-section that defines approximately one-half of an elliptical ring or approximately one-quarter of an elliptical ring.

In some embodiments, a dielectric pattern that defines a portion of an elliptical ring may be positioned directly above the lumped gate resistor.

In some embodiments, the gate structure may further comprise an outer contact that connects to an outer edge of the lumped gate resistor and an inner contact that connects to an inner edge of the lumped gate resistor.

In some embodiments, the lumped gate resistor may comprise a first material that has a first sheet resistance and the inner contact and the outer contact may each comprise materials that have a sheet resistance that is less than the first sheet resistance.

In some embodiments, a separation between an outer edge of the inner contact and an inner edge of the outer contact may be constant along the length of the lumped gate resistor. In other embodiments, a separation between an outer edge of the inner contact and an inner edge of the outer contact may vary along the length of the lumped gate resistor.

In some embodiments, the gate structure may further include a gate pad, one or more gate buses and a plurality of gate fingers, and wherein the lumped gate resistor is interposed electrically between the gate pad and the gate fingers.

Pursuant to additional embodiments of the present invention, semiconductor devices are provided that include a semiconductor layer structure and a gate structure on the semiconductor layer structure, the gate structure comprising a lumped gate resistor that is formed of a first material, an inner contact, and an outer contact. In these devices, at least one of the inner contact and the outer contact has a curved sidewall that is substantially aligned with a sidewall of the lumped gate resistor, and a resistance value of the lumped gate resistor is a function of a sheet resistance of the first material layer and a separation between the inner contact and the outer contact.

In some embodiments, both an outer edge of the inner contact and an inner edge of outer contact may have curved sidewalls.

In some embodiments, a separation between the outer edge of the inner contact and the inner edge of the outer contact may be constant along the length of the lumped gate resistor or may vary along the length of the lumped gate resistor. In some embodiments, the inner contact and the outer contact may each comprise a second material, and a sheet resistance of the first material may be greater than a sheet resistance of the second material.

In some embodiments, the gate structure may further comprise a gate pad and a plurality of gate fingers, where the inner contact electrically connects the gate pad to the lumped gate resistor and the outer contact electrically connects the lumped gate resistor to the gate fingers.

In some embodiments, at least a portion of the lumped gate resistor may have a horizontal cross-section that defines at least a portion of an elliptical ring. In some embodiments, a horizontal cross-section of the lumped gate resistor may define a semi-elliptical ring, and the lumped gate resistor may be positioned adjacent an edge of the semiconductor device. In some embodiments, a horizontal cross-section of the lumped gate resistor may define approximately one-quarter of an elliptical ring and the lumped gate resistor may be positioned adjacent a corner of the semiconductor device.

In some embodiments, a dielectric pattern having a cross-section that defines at least a portion of an elliptical ring may be positioned directly above the lumped gate resistor.

Pursuant to other embodiments of the present invention, semiconductor devices are provided that include a semiconductor layer structure and a gate structure on an upper side of the semiconductor layer structure, the gate structure comprising a dielectric pattern that has a curved inner sidewall and a curved outer sidewall.

In some embodiments, the gate structure may further comprise a lumped gate resistor that is directly underneath the dielectric pattern.

In some embodiments, the lumped gate resistor may be a portion of a semiconductor layer that is directly underneath the dielectric pattern, and first and second opposed sidewalls of the lumped gate resistor may be substantially aligned with first and second opposed sidewalls of the dielectric pattern.

In some embodiments, the gate structure may further comprise a gate pad, one or more gate buses and a plurality of gate fingers, and the lumped gate resistor may be interposed electrically between the gate pad and the one or more gate buses. In some embodiments, the gate pad and the one or more gate buses may each comprise a metal.

In some embodiments, the curved inner sidewall and the curved outer sidewall may define at least a portion of an elliptical ring (e.g., an annular ring).

In some embodiments, the curved inner sidewall and the curved outer sidewall may define approximately one-half of an annular ring.

In some embodiments, a first end of the annular ring may extend to a first edge of the semiconductor device and an opposed second end of the annular ring may also extend to the first edge of the semiconductor device.

In some embodiments, the curved inner sidewall and the curved outer sidewall may define approximately one-quarter of an annular ring.

In some embodiments, a first end of the annular ring may extend to a first edge of the semiconductor device and an opposed second end of the annular ring gate may extend to a second edge of the semiconductor device.

In some embodiments, the second edge of the semiconductor device may be adjacent the first edge of the semiconductor device.

In some embodiments, the semiconductor layer structure may comprise a plurality of wide bandgap semiconductor layers, and the lumped gate resistor may be on the upper side of the wide bandgap semiconductor layer structure and at least partly underneath the gate pad.

In some embodiments, the gate structure may further comprise a plurality of gate runners, each gate runner is associated with a respective one of the gate fingers, and the lumped gate resistor may be interposed electrically between the gate pad and each of the gate runners.

In some embodiments, the lumped gate resistor may be on top of a field oxide layer.

In some embodiments, a horizontal cross-section of the dielectric pattern may define a semi-elliptical ring, and the lumped gate resistor may be positioned adjacent an edge of the semiconductor device.

In some embodiments, a horizontal cross-section of the dielectric pattern may define approximately one-quarter of an elliptical ring, and the lumped gate resistor may be positioned adjacent a corner of the semiconductor device.

In some embodiments, at least a portion of the dielectric pattern may be underneath the gate pad.

In some embodiments, the gate structure may further comprise an inner contact that abuts the curved inner sidewall of the dielectric pattern and an outer contact that abuts the curved outer sidewall of the dielectric pattern.

Pursuant to yet additional embodiments of the present invention, semiconductor devices are provided that include a semiconductor layer structure that comprises a plurality of semiconductor layers that are stacked along a vertical direction and a gate structure on an upper side of the semiconductor layer structure, the gate structure comprising a lumped gate resistor. A horizontal cross-section of the lumped gate resistor has a curved inner surface and a curved outer surface In some embodiments, the curved inner surface and the curved outer surface may define at least a portion of an elliptical ring.

In some embodiments, the gate structure may further include a gate pad, one or more gate buses and a plurality of gate fingers, and the lumped gate resistor may be interposed electrically between the gate pad and the gate fingers. In some embodiments, the gate pad and the one or more gate buses may each comprise a metal, and the gate fingers may comprise a semiconductor material.

In some embodiments, the lumped gate resistor may be within a semiconductor layer.

In some embodiments, the horizontal cross-section of the lumped gate resistor may define at least a portion of an annular ring (e.g., approximately one-half of an annular ring or approximately one-quarter of an annular ring).

In some embodiments, the semiconductor layer structure may comprise a plurality of wide bandgap semiconductor layers, and the lumped gate resistor may be on the upper side of the wide bandgap semiconductor layer structure and at least partly underneath the gate pad.

In some embodiments, the horizontal cross-section of the lumped gate resistor may define a semi-elliptical ring, and the lumped gate resistor may be positioned adjacent an edge of the semiconductor device.

In some embodiments, the horizontal cross-section of the lumped gate resistor may define approximately one-quarter of an elliptical ring and the lumped gate resistor may be positioned adjacent a corner of the semiconductor device.

In some embodiments, a dielectric layer having a horizontal cross-section that defines at least a portion of an elliptical ring may be positioned directly above the lumped gate resistor.

In some embodiments, the lumped gate resistor may be formed in a polysilicon layer.

Pursuant to still other embodiments of the present invention, semiconductor devices are provided that include a semiconductor layer structure, a gate resistor layer on an upper side of the semiconductor layer structure, an inner contact that is directly on the upper side of the gate resistor layer, an outer contact that is directly on the upper side of the gate resistor layer, and an outer dielectric pattern that is directly on an upper side of the gate resistor layer in between the inner contact and the outer contact. A distance between an outer sidewall of the inner contact and an inner sidewall of the outer contact varies.

In some embodiments, these semiconductor devices may further include an inner dielectric pattern that is directly on the upper side of the gate resistor layer, where the inner contact is in between the inner dielectric pattern and the outer dielectric pattern.

BRIEF DESCRIPTION OF DRAWINGS

FIG. 2E is a schematic horizontal cross-sectional view of the region "A" of the power MOSFET of FIG. 1A where the cross-section is taken at the level in the device structure of a semiconductor layer that is formed underneath the gate pad.

FIG. 2F is a schematic vertical cross-section taken along line 2F-2F of FIG. 2E.

DETAILED DESCRIPTION

Figure 1A:
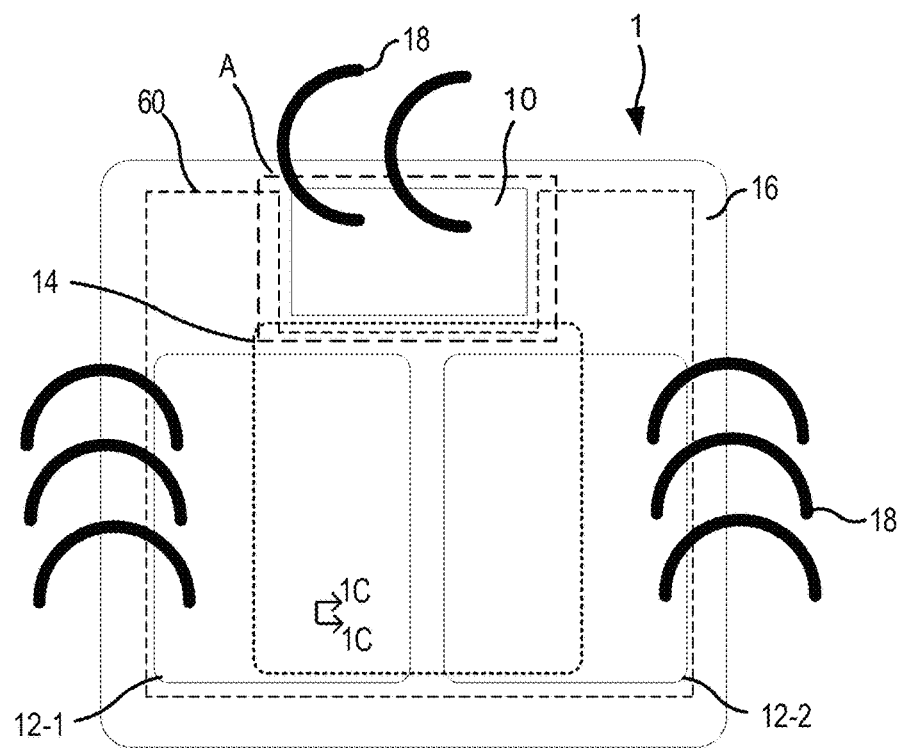
FIG. 1A is a schematic plan view of a conventional power MOSFET.

Power semiconductor devices such as MOSFETs, IGBTs, gate-controlled thyristors and the like may include lumped gate resistors that are designed to increase the gate resistance to desired values. These lumped gate resistors may improve the performance of the device, but it may be important that any variation in the resistance value of the lumped gate resistor due to manufacturing tolerances be kept as small as possible, as even small variations from an ideal resistance value can negatively affect the performance of the power semiconductor device. Conventionally, lumped gate resistors are implemented by routing a current path for the gate signal through a high resistance material. The resistance of a conventional lumped gate resistor is a function of a length of the resistor, a width of the resistor and a sheet resistance of the material in which the resistor is formed. Due to manufacturing tolerances, the length and the width of the resistor may vary from ideal their values, and this variance may be large enough to impact the performance of the device.

Pursuant to embodiments of the present invention, power semiconductor devices are provided that have lumped gate resistors that are connected to both an inner contact and an outer contact. The resistors are designed so that the gate current will flow from the inner contact, across the resistor, to the outer contact. In these devices, the outer contact may "enclose" the inner contact within an inactive area of the device. By "enclosed" by the outer contact it is meant that, in a horizontal cross-section through the device (i.e., a two-dimensional cut through the device taken along a plane that is parallel to a major surface of the semiconductor layer structure), the outer contact, either by itself or in conjunction with one or more outer edges of the device, surrounds the inner contact. The lumped gate resistor may therefore have a resistance value that depends on only the width of the gap between the inner and outer contacts and the sheet resistance of the material in which the resistor is formed. Since the lumped gate resistors according to embodiments of the present invention may only be dependent on one parameter that is impacted by manufacturing tolerances (namely the width of the gap), they may exhibit less variation in resistance due to manufacturing tolerances. These lumped gate resistors may be formed under the gate pad in some embodiments, as this may allow the gate resistor to be implemented without increasing the size of the device or reducing the size of the active area.

In some embodiments of the present invention, the inner contact may have a curved outer surface and the outer contact may have a curved inner surface. Such a design may form a lumped gate resistor that has curved inner and outer surfaces. In some embodiments, the lumped gate resistors may have horizontal cross-sections that define an elliptical ring. An elliptical ring is formed by starting with a first (outer) ellipse and then removing a smaller second (inner) ellipse from the center of the first ellipse. Both ellipses have the same difference between their semi-major and semi-minor axis such that the distance between any point on the inner ellipse to the closest corresponding point on the outer ellipse is constant. An annular ring (also referred to as a circular ring) is a special case of an elliptical ring where each ellipse has a constant radius.

In some embodiments, the lumped gate resistor may have a horizontal cross-section that is a full elliptical ring. For example, in cases where the gate pad is formed on a central region of the upper side of the semiconductor layer structure of the device, the lumped gate resistor may be formed to have the shape of an elliptical ring (e.g., an annular lumped gate resistor). In other embodiments, the lumped gate resistor may have a horizontal cross-section that is only a portion of an elliptical ring. For example, in cases where the gate pad is formed along a first edge of the upper side of the semiconductor layer structure of the device, the lumped gate resistor may have the shape of a semi-elliptical ring, with the flat side of the semi-elliptical ring being parallel to the first edge of the device. As another example, in cases where the gate pad is provided in a corner of the upper side of the semiconductor layer structure of the device, the lumped gate resistor may have the shape of one-quarter of an elliptical ring. In each of the above cases, the elliptical ring may be a circular ring, although it need not be.

While in some embodiments the horizontal cross-section of the lumped gate resistors may define an elliptical ring, it will be appreciated that embodiments of the present invention are not limited thereto. For example, in other embodiments, lumped gate resistors are provided that have horizontal cross-sections with other closed shapes such as square rings, hexagonal rings, rings with varying widths and the like. These rings may be full rings or may be partial rings that have first and second ends that extend to the periphery of the semiconductor device. The "periphery" of the semiconductor device may be an edge of the semiconductor device or a structure that extends in parallel to the edge of the semiconductor device that defines an outer edge of a working region of the device.

The lumped gate resistors according to embodiments of the present invention may, in some embodiments, be formed in a semiconductor layer, as semiconductor materials have a higher sheet resistance than the metals that are used to form the gate pad and potentially other portions of the gate structure (e.g., gate busses, gate runners, etc.). For example, the electrical path connecting the gate pad to the gate fingers may be routed through a portion of a semiconductor layer, and this portion of the electrical path acts as a lumped gate resistor that increases the total gate resistance. The semiconductor layer may comprise, for example, a polysilicon layer, and in some embodiments may be part of a polysilicon layer in which the gate fingers are formed in the active region of the device.

The gate current will tend to follow the lowest resistance path between the gate pad and the gate fingers. Typically, the semiconductor layer (also referred to more generally herein as a gate resistor layer) in which the lumped gate resistor is formed will be at a "lower" layer of the device than the gate pad. In other words, the semiconductor layer in which the lumped gate resistor is formed may be closer to a wide bandgap semiconductor layer structure of the device than is the gate pad. The lumped gate resistor may be formed by forming a dielectric pattern within the metal layers that are formed above the semiconductor layer. The dielectric pattern blocks the gate current from flowing directly from a first metal region of the gate structure to a second metal region of the gate structure, instead forcing the gate current to flow from the first metal region to the semiconductor layer and from the semiconductor layer to the second metal region. The first metal region on the inner side of the dielectric pattern may act as a first contact to the lumped gate resistor, and the second metal region on the outer side of the dielectric pattern may act as a second contact to the lumped gate resistor. The gate current flows from the gate pad through the gate metal to the first contact, and then flows through the portion of the semiconductor layer underneath the dielectric pattern (that has, for example, the shape of at least a portion of an elliptical dielectric ring) to the second contact, where the current flows back into the gate metal. Thus, it will be understood that, due to the tendency of the gate current to seek out the lowest resistance path, a lumped gate resistor that has a full or partial elliptical ring shape may be formed by forming a dielectric pattern that has a full or partial elliptical ring shape within a metal layer on top of the gate resistor layer.

In some embodiments, semiconductor devices are provided that comprise a semiconductor layer structure having an active area with a plurality of unit cell transistors and an inactive gate pad area. A gate resistor layer is provided on an upper side of the semiconductor layer structure. An inner contact and an outer contact are formed directly on the upper side of the gate resistor layer. The outer contact encloses the inner contact within the inactive gate pad area of the semiconductor device. As discussed above, by "enclosed" by the outer contact it is meant that, in a horizontal cross-section through the device (i.e., a two-dimensional cut through the device taken along a plane that is parallel to a major surface of the semiconductor layer structure), the outer contact, either by itself or in conjunction with one or more outer edges of the device, surrounds the inner contact. An inner dielectric pattern may be provided directly on the upper side of the gate resistor layer in between the inner contact and the outer contact. A lumped gate resistor may be defined in the gate resistor layer directly underneath the inner dielectric pattern.

In other embodiments, semiconductor devices are provided that comprise a and a gate structure that includes a lumped gate resistor on an upper side of a semiconductor layer structure. A horizontal cross-section of the lumped gate resistor defines a closed shape such as, for example, an elliptical ring. A dielectric pattern having a horizontal cross-section that defines a second closed shape may be positioned directly above the lumped gate resistor. The second closed shape may be the same shape as the first closed shape.

In still other embodiments, semiconductor devices are provided that comprise a gate structure that includes a lumped gate resistor on an upper side of a semiconductor layer structure. A first end and an opposed second end of the lumped gate resistor each extend to a periphery of the semiconductor device. In some embodiments, the first and second ends of the lumped gate resistor may extend to a first edge of the semiconductor device. In other embodiments, the first end may extend to a first edge of the semiconductor device and the second end may extend to a second edge of the semiconductor device.

In still other embodiments, semiconductor devices are provided that comprise a gate structure on a semiconductor layer structure. The gate structure comprising a lumped gate resistor, an inner contact, and an outer contact. At least one of the inner contact and the outer contact has a curved sidewall that is substantially aligned with an edge of the lumped gate resistor. In these devices a resistance value of the lumped gate resistor may be a function of a sheet resistance of a material forming the lumped gate resistor and a separation between the inner and outer contacts.

In still other embodiments, semiconductor devices are provided that comprise a gate structure on an upper side of a semiconductor layer structure. The gate structure comprising a dielectric pattern that has a curved inner sidewall and a curved outer sidewall. A lumped gate resistor may be provided directly underneath the dielectric pattern.

In still other embodiments, semiconductor devices are provided that comprise a semiconductor layer structure that comprises a plurality of semiconductor layers that are stacked along a vertical direction and a gate structure on an upper side of the semiconductor layer structure, the gate structure comprising a lumped gate resistor. A horizontal cross-section of the lumped gate resistor has a curved inner surface and a curved outer surface.

In still other embodiments, semiconductor devices are provided that comprise a gate resistor layer on an upper side of a semiconductor layer structure, an inner contact that is directly on the upper side of the gate resistor layer, an outer contact that is directly on the upper side of the gate resistor layer and an outer dielectric pattern that is directly on an upper side of the gate resistor layer in between the inner contact and the outer contact. A distance between an outer sidewall of the inner contact and an inner sidewall of the outer contact varies. The semiconductor device may further comprise an inner dielectric pattern that is directly on the upper side of the gate resistor layer, wherein the inner contact is in between the inner dielectric pattern and the outer dielectric pattern.

Figure 1B:
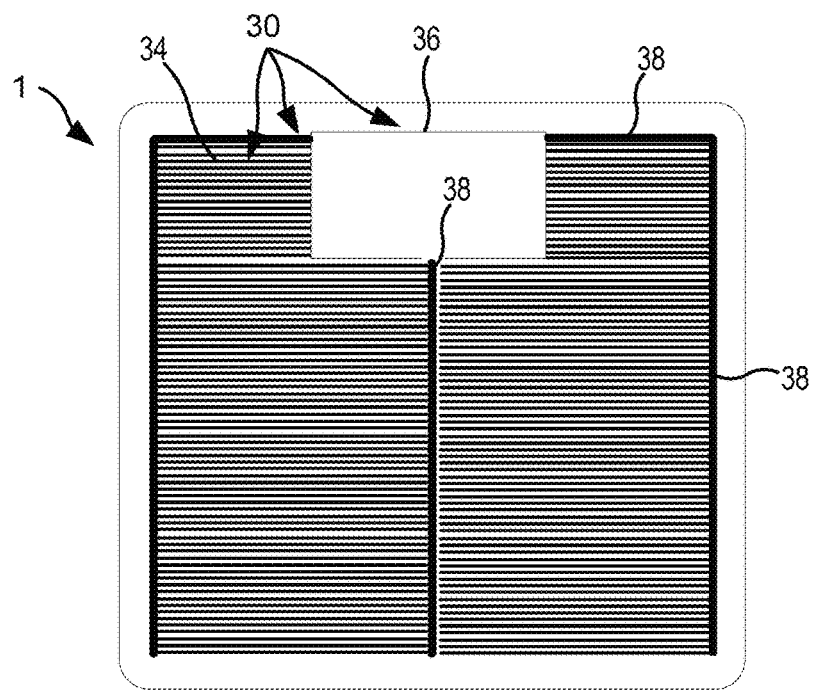
FIG. 1B is a schematic plan view of the power MOSFET of FIG. 1A with the top layers thereof removed.
Figure 1C:
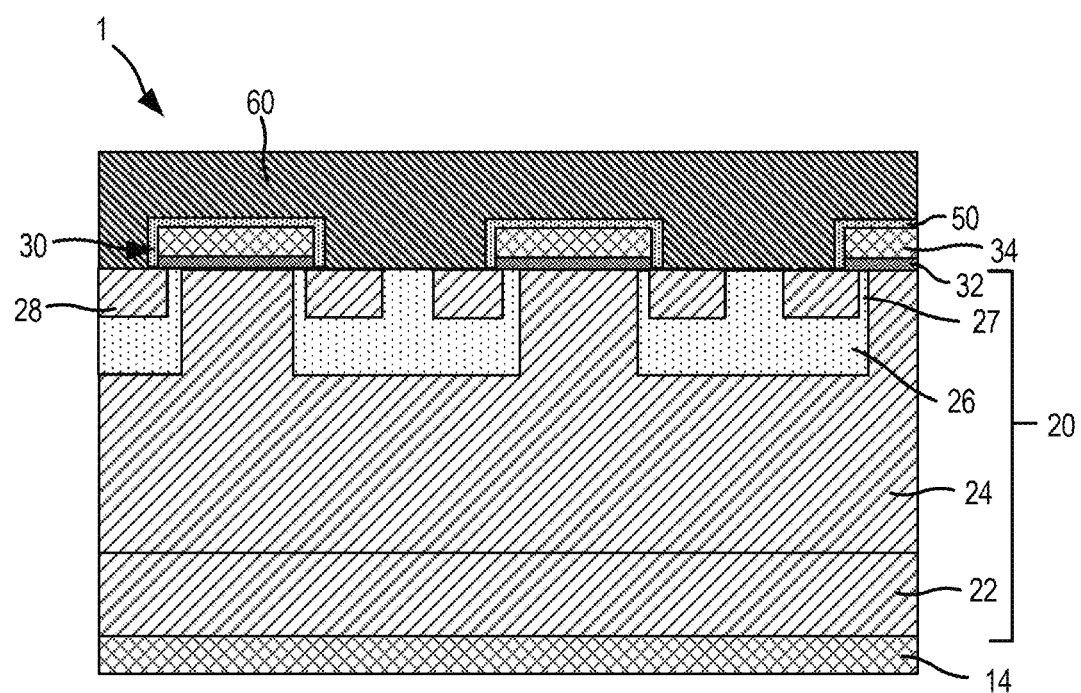
FIG. 1C is a schematic vertical cross-section taken along line 1C-1C of FIG. 1A.

Before describing specific examples of semiconductor devices according to embodiments of the present invention, the structure and operation of a conventional power MOSFET 1 will be described in detail with reference to FIGS. 1A-1C. In particular, FIG. 1A is a schematic plan view of the conventional power MOSFET 1, while FIG. 1B is a schematic plan view of the power MOSFET 1 with a passivation layer, a top-side source metallization structure, a gate bond pad and an inter-metal dielectric pattern thereof omitted. FIG. 1C is a schematic cross-sectional diagram taken along line 1C-1C of FIG. 1A that illustrates one full unit cell and portions of two additional unit cells of MOSFET 1.

The power MOSFET 1 includes a semiconductor layer structure 20 (FIG. 1C) and a plurality of metal layers that are formed on either side of the semiconductor layer structure 20. Referring first to FIG. 1A, a gate bond pad 10 and one or more source bond pads 12-1, 12-2 are formed on the upper side of the semiconductor layer structure 20 (FIG. 1C), and a drain pad 14 (shown as a dotted box in FIG. 1A) is provided on the bottom side of the MOSFET 1. Each of the gate and source pads 10, 12 may be formed of a metal, such as aluminum, that bond wires can be readily attached to via conventional techniques such as thermo-compression or soldering. The drain pad 14 may be formed of a metal that may be connected to an underlying submount such as a lead frame, a heat sink, a power substrate or the like via soldering, brazing, direct compression or the like.

The MOSFET 1 includes a source metallization structure 60 that electrically connects source regions 28 in the semiconductor layer structure 20 of the MOSFET 1 to an external device or voltage source that is electrically connected to the source bond pads 12-1, 12-2. The source metallization structure 60 is indicated by a dashed box in FIG. 1A as significant portions of the top-side metallization structure 60 are covered by a protective layer 16 such as a polyimide layer. The source bond pads 12-1, 12-2 may be portions of the source metallization structure 60 that are exposed through openings in the protective layer 16 in some embodiments. Bond wires 18 are shown in FIG. 1A that may be used to connect the gate bond pad 10 and the source bond pads 12-1, 12-2 to external circuits or the like. The drain pad 14 may be connected to an external circuit through an underlying submount (not shown) on which MOSFET 1 is mounted.

Referring to FIGS. 1B-1C, a gate structure 30 is provided that includes a plurality of gate insulating fingers 32 (FIG. 1C), a plurality of gate fingers 34 (FIGS. 1B-1C), a gate pad 36 (FIG. 1B), and one or more gate buses 38 (FIG. 1B) that electrically connect the gate fingers 34 to the gate pad 36. Gate runners (not shown) may optionally be provided. These gate runners may, for example, run above the gate fingers 34 and may electrically connect the gate fingers 34 to the gate buses 38. The electrical connections between the gate fingers 34, any gate runners, and the gate buses 38 may be conventional and hence will not be described herein. The gate insulating fingers 32 may comprise, for example, silicon oxide, and may insulate the gate fingers 34 from the underlying semiconductor layer structure 20. The gate fingers 34 may comprise, for example, a polysilicon pattern in some embodiments, although other conductive patterns could alternatively be used. The gate fingers 34 may extend horizontally across the device (as shown in FIG. 1B), or may alternatively comprise a planar layer that extends across the upper surface of the semiconductor layer structure 20 that has openings therein through which the top-side source metallization structure 60 (discussed below) connects to the source regions 28 in the semiconductor layer structure 20. Other configurations may be used (e.g., the unit cells may have a hexagonal configuration, the gate fingers 34 may extend vertically rather than horizontally, etc.). In some embodiments, the gate fingers 34 may be formed within trenches in the upper surface of the semiconductor layer structure 20, as forming the gate fingers 34 within such trenches can improve, for example, the carrier mobility of the MOSFET 1. The gate pad 36 may be directly underneath and electrically connected to the gate bond pad 10. In some embodiments, the gate pad 36 and the gate bond pad 10 may comprise a single monolithic structure. The gate pad 36 and the gate buses 38 may comprise metal structures in example embodiments.

Referring to FIG. 1C, the unit cell transistors may be formed on an n-type silicon carbide semiconductor substrate 22 such as, for example, a single crystal 4H silicon carbide semiconductor substrate that is heavily-doped (e.g., between $1 \times 10^{18}$ atoms/cm$^3$ and $1 \times 10^{21}$ atoms/cm$^3$) with n-type impurities. The substrate 22 may have any appropriate thickness (e.g., between 100 and 500 microns thick), and may be partially or fully removed in some embodiments. It will be appreciated that the thickness of the substrate 22 and other layers are not drawn to scale in FIG. 1C.

A drain pad 14 may be formed on the lower surface of the semiconductor substrate 22. The drain pad 14 may serve as an ohmic contact to the semiconductor substrate 22 and as a pad that provides an electrical connection between the drain terminal of the MOSFET 1 and external devices. The drain pad 14 may comprise, for example, metals such as nickel, titanium, tungsten and/or aluminum, and/or alloys and/or thin layered stacks of these and/or similar materials.

A lightly-doped n-type (n) silicon carbide drift region 24 is provided on an upper surface of the substrate 22. The n-type silicon carbide drift region 24 may, for example, be formed by epitaxial growth on the silicon carbide substrate 22. The n-type silicon carbide drift region 24 may have, for example, a doping concentration of $1 \times 10^{14}$ to $5 \times 10^{16}$ dopants/cm$^3$. The n-type silicon carbide drift region 24 may be a thick region, having a vertical height above the substrate 22 of, for example, 3-100 microns. It will be appreciated that the thickness of the drift region 24 is not drawn to scale in FIG. 1C. While not shown in FIG. 1C, in some embodiments an upper portion of the n-type silicon carbide drift region 24 may be more heavily doped (e.g., a doping concentration of $1 \times 10^{16}$ to $1 \times 10^{17}$ dopants/cm$^3$) than the lower portion thereof to provide a current spreading layer in the upper portion of the n-type silicon carbide drift region 24.

P-type well regions 26 are formed in upper portions of the n-type drift region 24. Heavily-doped (n$^+$) n-type silicon carbide source regions 28 may then be formed in upper portions of the well regions 26 by, for example, ion implantation. Channel regions 27 are defined in the sides of the well regions 26. The substrate 22, the drift region 24, the well regions 26 and the source regions 28 may together comprise the semiconductor layer structure 20 of the MOSFET 1. The semiconductor layer structure 20 may be a wide bandgap semiconductor layer structure 20 (i.e., a semiconductor layer structure 20 formed of wide bandgap semiconductor materials).

After the n-type source regions 28 are formed, a plurality of gate insulating fingers 32 (which collectively comprise a gate insulating pattern) may be formed on the upper surface of the semiconductor layer structure 20. Each gate insulating finger 32 may comprise, for example, an elongated strip of dielectric material such as silicon oxide, silicon nitride, silicon oxynitride or the like. Gate fingers 34 such as polysilicon gate fingers 34 are formed on each gate insulating finger 32. The gate fingers 34 and the gate insulating fingers 32, along with the gate bond pad 110, the gate pad 36, the gate bus(es) 38 and any gate runners, may collectively comprise the gate structure 30. As noted above, vertically-extending portions of the well regions 26 that are between the source regions 28 and the portions of the drift region 24 that are directly under each gate finger 34 comprise channel regions 27. The channel regions 27 electrically connect the n-type source regions 28 to the drift region 24 when a sufficient bias voltage is applied to the gate fingers 34. When the bias voltage is applied to the gate fingers 34, current may flow from the n-type source regions 28 through the channel regions 27 to the drift region 24 and then to the drain pad 14.

As shown in FIG. 1C, an inter-metal dielectric pattern 50 is formed to cover upper and side surfaces of the gate insulating fingers 32 and the gate fingers 34 in order to electrically isolate the gate fingers 34 from the source metallization structure 60. While not shown in FIG. 1C, the inter-metal dielectric pattern 50 may also electrically insulate the gate pad 36 and/or the gate bus(es) 38 from the source metallization structure 60. The inter-metal dielectric pattern 50 may comprise a plurality of individual dielectric fingers 52 that cover the respective gate fingers 34, as well as additional dielectric structures in the gate pad region of the device. The inter-metal dielectric pattern 50 may, for example, comprise one or more of a silicon oxide pattern, a silicon nitride pattern, an aluminum oxide, a magnesium oxide or mixtures of these or other oxides and nitrides with silicon dioxide to form silicate or oxy-nitride alloyed dielectrics. As noted above, the gate fingers 34 of the electrode structure 30 may be polysilicon gate fingers. It will therefore be appreciated that in some embodiments the "inter-metal" dielectric pattern 50 may be a pattern that is formed to insulate a semiconductor pattern from a metal pattern as opposed to insulating two metal patterns from each other.

The source metallization structure 60 may be formed on the inter-metal dielectric pattern 50. The source metallization structure 60 may include one or more layers such as, for example, a diffusion barrier layer and a bulk metal layer.

FIGS. 2A-2H illustrate how a lumped gate resistor may be included in the conventional power MOSFET 1 of FIGS. 1A-1C.

Figure 2A:
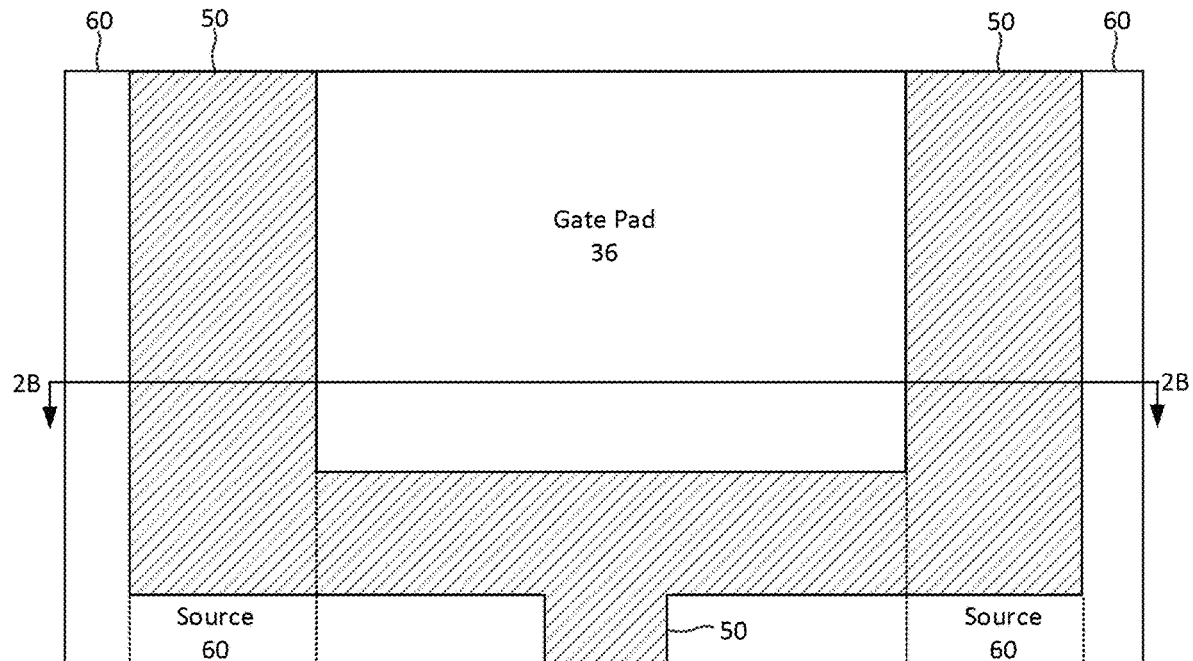
FIG. 2A is a schematic horizontal cross-sectional view of the region "A" of the conventional power MOSFET of FIG. 1A with the passivation layer and the gate bond pad thereof removed.
Figure 2B:
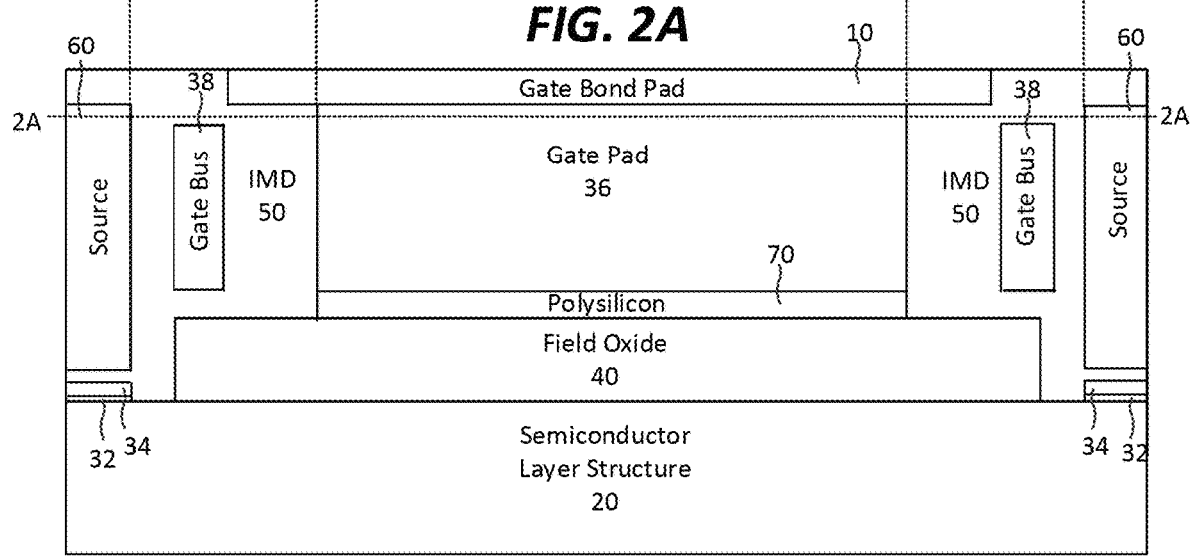
FIG. 2B is a schematic vertical cross-section taken along line 2B-2B of FIG. 2A.

FIG. 2A is a schematic horizontal cross-sectional view of the region of the power MOSFET 1 of FIG. 1A that is labeled "A" with the passivation layer 16 and the gate bond pad 10 thereof removed. As shown in FIG. 2A, a gate pad 36 is formed underneath the gate bond pad 10 (FIG. 2B). The inter-metal dielectric layer 50 electrically isolates the gate pad 36 from the source metallization 60.

FIG. 2B is a schematic vertical cross-section taken along line 2B-2B of FIG. 2A. As shown in FIG. 2B, a field oxide layer 40 (e.g., a thick silicon oxide layer) is formed on the semiconductor layer structure 20 underneath the gate pad 36. A polysilicon layer 70 is formed on the upper surface of the field oxide layer 40. The polysilicon layer 70 may extend into the active region of the device (as shown at the side edges of FIG. 2B) and may be patterned to form the gate fingers 34 on top of the respective gate insulating fingers 32. The gate pad 36 is formed on the upper surface of the polysilicon layer 70, and the gate bond pad 10 is formed on the upper surface of the gate pad 36. The gate pad 36 and the gate bond pad 10 may comprise a monolithic structure or two or more separate layers. One or more gate buses 38 are formed on top of the polysilicon layer 70. Two gate buses 38 are visible in the cross-section of FIG. 2B. The gate buses 38 do not extend as far above the semiconductor layer structure 20 as the gate pad 36, so that the inter-metal dielectric layer 50 covers the top surface of each gate bus 38. The inter-metal dielectric layer 50 electrically isolates the gate pad 36 and the gate buses 38 from the source metallization structure 60. Line 2A-2A in FIG. 2B illustrates the level of the MOSFET 1 where the horizontal cross-section of FIG. 2A is taken.

Figure 2C:
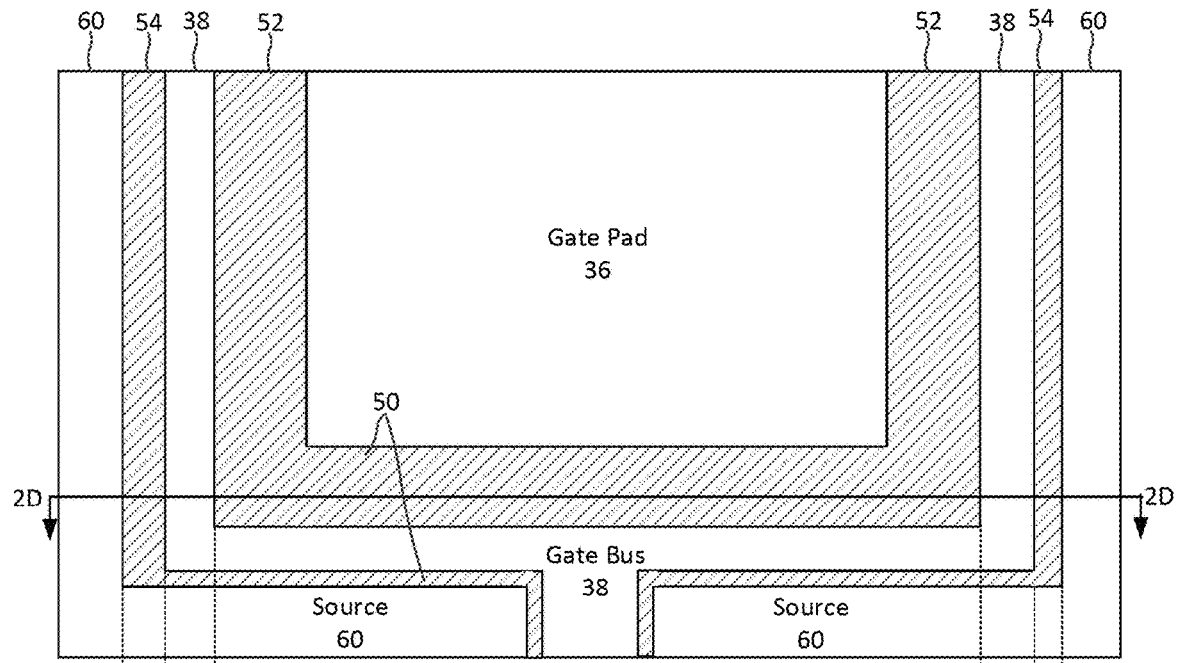
FIG. 2C is a schematic horizontal cross-sectional view of the region "A" of the power MOSFET of FIG. 1A where the cross-section is taken at the level in the device structure of the gate buses.

FIG. 2C is a schematic horizontal cross-sectional view of the region "A" of the power MOSFET 1 where the cross-section is taken at the level in the device structure of the gate buses 38. As shown in FIG. 2C, an inner portion 52 of the inter-metal dielectric pattern 50 separates the gate pad 36 from the gate buses 38. The gate buses 38 may surround the gate pad 36 and may extend throughout the MOSFET 1 to carry a gate signal that is applied to the gate bond pad 10 to the gate fingers 34. An outer portion 54 of the inter-metal dielectric pattern 50 separates the gate buses 38 from the source metallization 60. The inner and outer portions 52, 54 of the inter-metal dielectric layer 50 may be a monolithic structure in some embodiments, as shown in FIG. 2D.

Figure 2D:
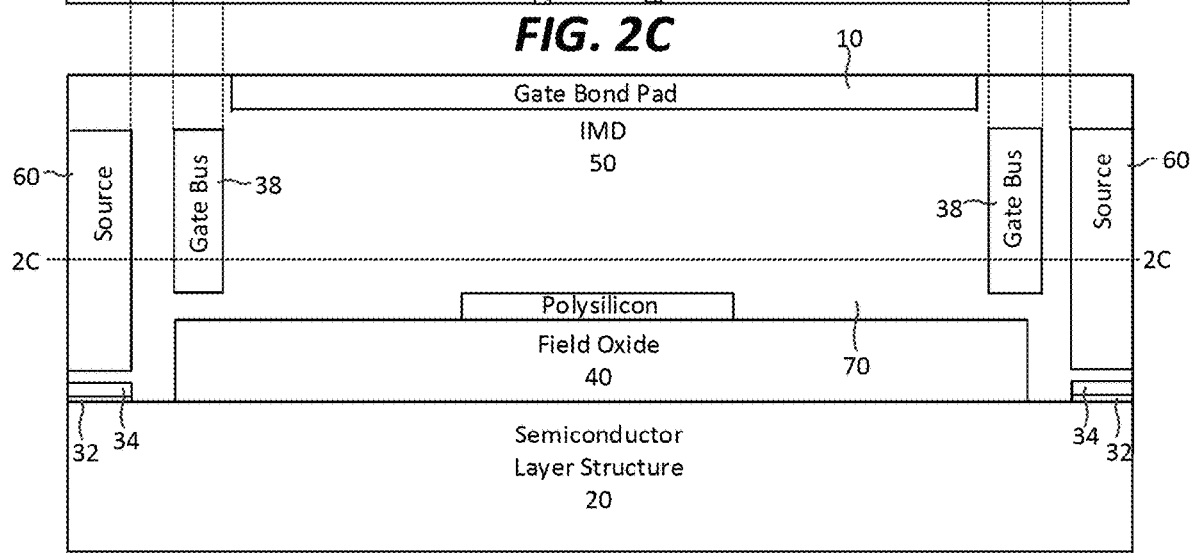
FIG. 2D is a schematic vertical cross-section taken along line 2D-2D of FIG. 2C.

FIG. 2D is a schematic vertical cross-section taken along line 2D-2D of FIG. 2C. As can be seen, the cross-section of FIG. 2D is similar to the cross-section of FIG. 2B. However, the cross-section of FIG. 2D is taken through the inter-metal dielectric pattern 50 instead of through the gate pad 36. FIGS. 2A-2D together illustrate how the inter-metal dielectric pattern 50 separates the gate pad 36 from the gate buses 38 so that the gate current cannot flow directly from the gate pad 36 to the gate bus 38. The line 2C-2C in FIG. 2D illustrates the level of the MOSFET 1 where the horizontal cross-section of FIG. 2C is taken FIG. 2E is a schematic horizontal cross-sectional view of the region "A" of the power MOSFET 1 where the cross-section is taken at the level in the device structure of the polysilicon semiconductor layer 70. As shown in FIG. 2E, the inter-metal dielectric pattern 50 also extends into the polysilicon layer 70 that underlies the gate pad 36 and the gate buses 38. The inter-metal dielectric pattern 50 separates the polysilicon pattern 70 into an inner region 72 and an outer region 74. An opening 58 is provided in the inter-metal dielectric pattern 50 that allows current to flow from the inner portion 72 of the polysilicon pattern 70 to the outer portion 74 of the polysilicon pattern 70. As will explained below, the portion 76 of the polysilicon layer 70 that is in the opening 52 in the inter-metal dielectric pattern 50 forms a lumped gate resistor 76 that may be used to increase the resistance of the gate structure 30.

FIG. 2F is a schematic vertical cross-section taken along line 2F-2F of FIG. 2E. As shown in FIG. 2F, because of the opening 58 in the inter-metal dielectric pattern 50, the polysilicon pattern 70 includes a portion 76 that connects the inner portion 72 to the outer portion 74. Thus, a current path is provided in the polysilicon pattern 70 that allows a gate current that is applied to the gate bond pad 10 to flow through the gate pad 36 and then through the portion of the polysilicon pattern 70 that is beneath the opening 58 in the inter-metal dielectric pattern 50 to the outer portion 74 of the polysilicon pattern 70, where the gate current can then flow into the gate buses 38. The line 2E-2E in FIG. 2F illustrates the level of the MOSFET 1 where the horizontal cross-section of FIG. 2E is taken.

Figure 2G:
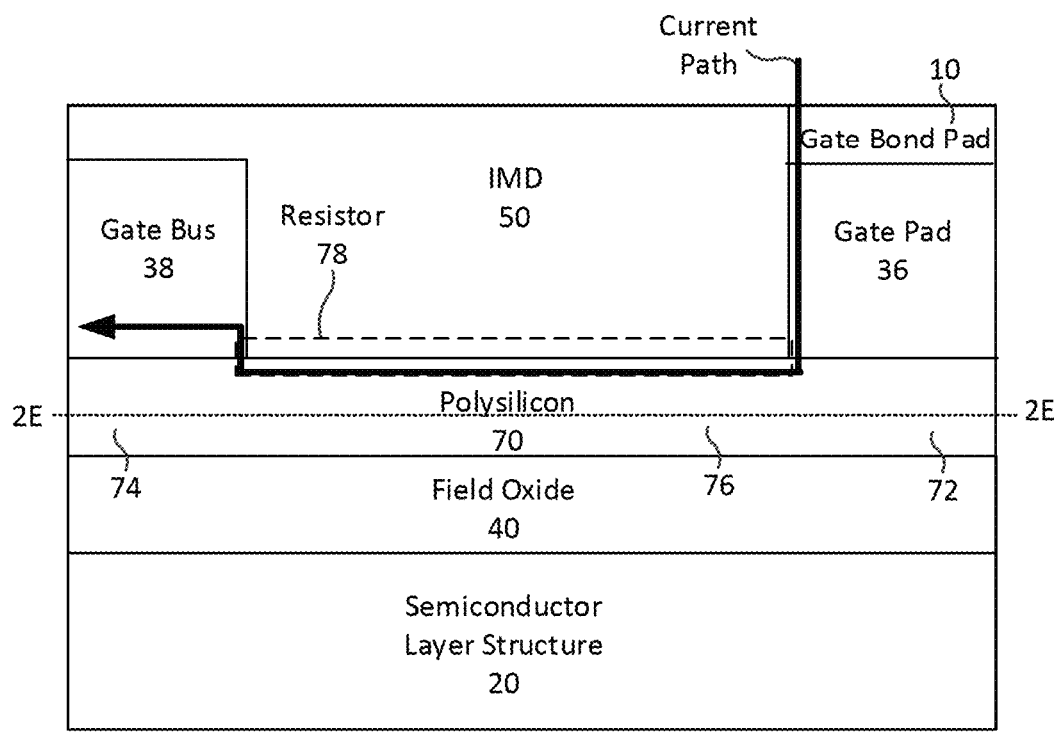
FIG. 2G is a schematic vertical cross-section taken along line 2G-2G of FIG. 2E.
Figure 2H:
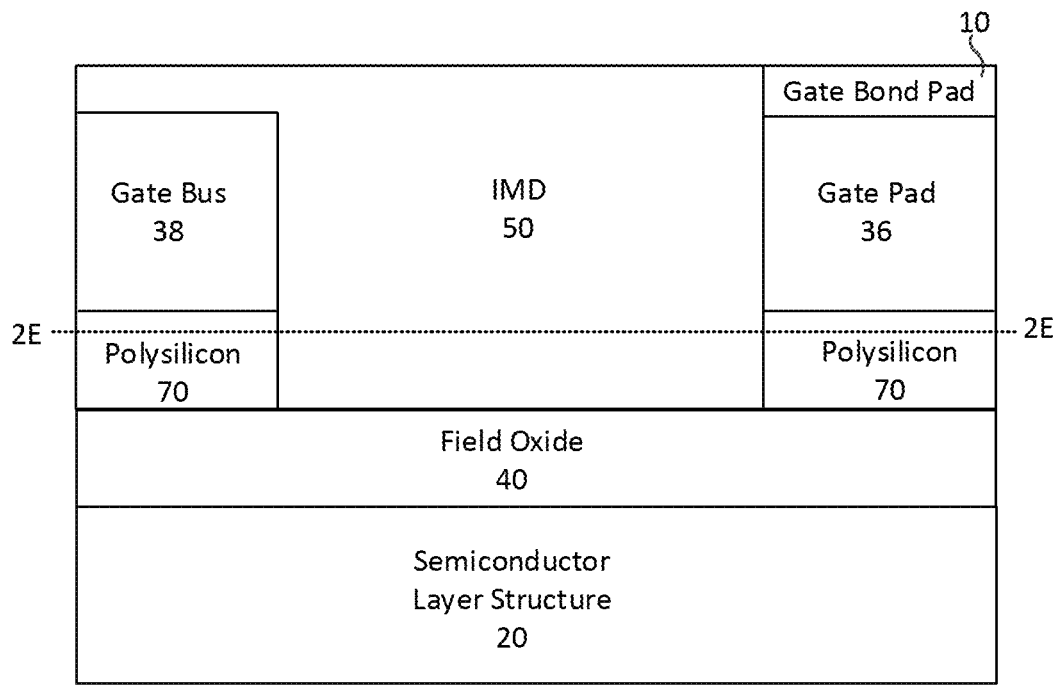
FIG. 2H is a schematic vertical cross-section taken along line 2H-2H of FIG. 2E.

FIGS. 2G and 2H are vertical cross-sections taken through the MOSFET 1 at the locations of lines 2G-2G and 2H-2H, respectively, of FIG. 2E.

Referring to FIG. 2G, when a bias voltage is applied to the gate bond pad 10, it flows downwardly to the gate pad 36 and into the inner portion 72 of the polysilicon layer 70. The current flows through the portion 76 of the polysilicon layer 70 that is between the inner portion 72 and the outer portion 74 and then follows the least resistance path into the gate bus 38. The gate current will primarily flow at or near the upper surface of the portion 76 of the polysilicon layer 70 that is between the inner portion 72 and the outer portion 74 and will exit the polysilicon layer 70 as soon as the current can flow into the gate bus 38. The polysilicon layer 70 has a substantially higher resistance than the metal used to form the gat bond pad 10, the gate pad 36 and the gate bus 38, so the portion of the gate current path that flows through the polysilicon layer 70 may act as a lumped gate resistor 78 that is interposed on the gate current path between the gate pad 36 and the gate bus 38.

Referring to FIG. 2H, it can be seen that the inter-metal dielectric layer 50 extends all the way through the polysilicon pattern 70 to an underlying field oxide layer 40. As a result, current cannot flow from the inner portion 72 of the polysilicon layer 70 to the outer portion 74 in the portion of the device shown in cross-section of FIG. 2H. In other words, the gate current can only flow from the inner portion 72 of the polysilicon layer 70 to the outer portion 74 thereof in the region of the opening 58 in the inter-metal dielectric pattern 50 shown in FIG. 2E, and hence the portion 76 of the polysilicon layer 70 in the opening 58 acts as the lumped gate resistor 78.

Referring again to FIG. 2E, it can be seen that the resistance of the gate resistor 78 is a function of the width W of the opening 58, the length L of the opening 58, and the sheet resistance of the polysilicon material (or other material of the gate resistor layer). The dimensions of the portion of the inter-metal dielectric pattern 50 that defines the opening 58 may be varied so that the lumped gate resistor 78 may have a desired resistance value. Specifically, the length L and/or the width W may be increased to provide more resistance, or may be decreased to provide less resistance. As noted above, due to manufacturing tolerances, the length L and the width W of resistor 78 may vary between MOSFETs 1 formed on different wafers and even between MOSFETs 1 formed on the same wafer. Purchasers of power semiconductor devices often specify very tight ranges for the cumulative gate resistance of a power semiconductor device such as power MOSFET 1. For example, a customer may specify a gate resistance value along with a tolerance of +/−5%, or even less. These tight tolerances may be required because the cumulative gate resistance may directly affect the switching speed of the device, and if the device does not exhibit the appropriate switching speed for the application in which it is used, undesired oscillations or other undesired behavior may arise that can negatively affect system performance. The manufacturing tolerances in controlling the dimensions of L and W in FIG. 2E may be sufficiently large that it may be difficult to guarantee that devices will have cumulative gate resistances within the range specified by some customers and/or for some applications.

Figure 3A:
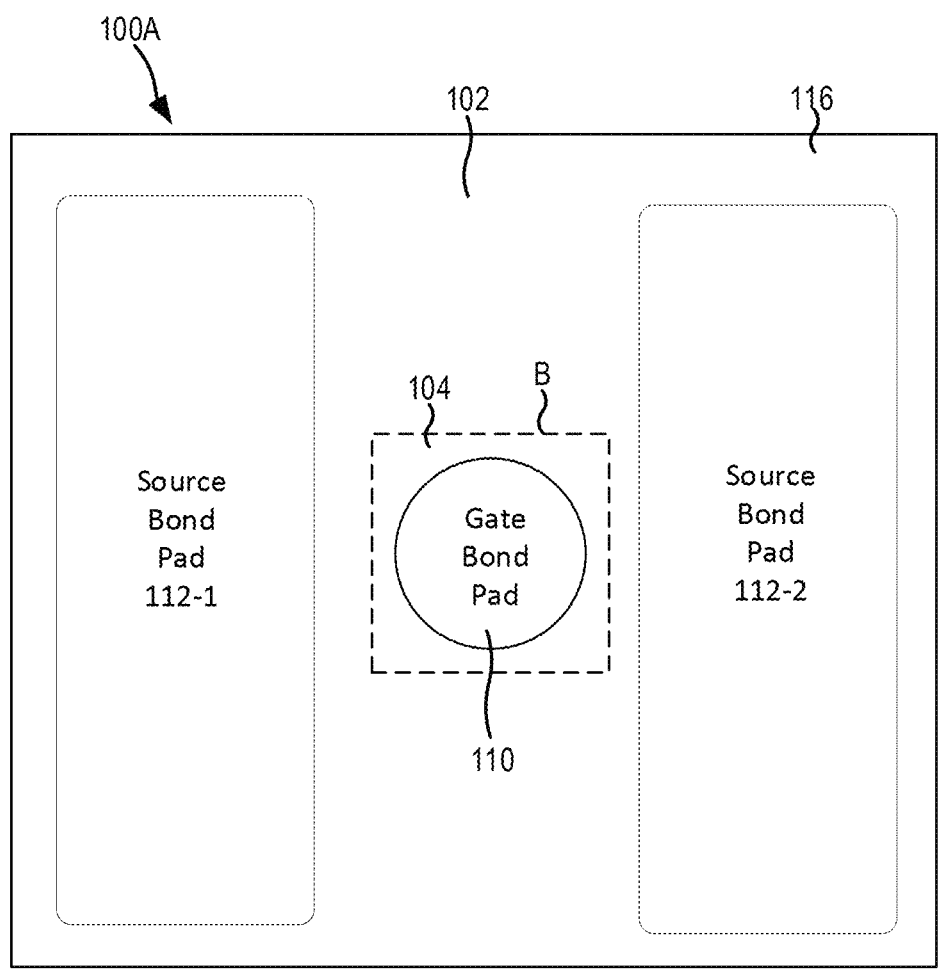
FIG. 3A is a schematic plan view of a power MOSFET according to embodiments of the present invention.
Figure 3B:
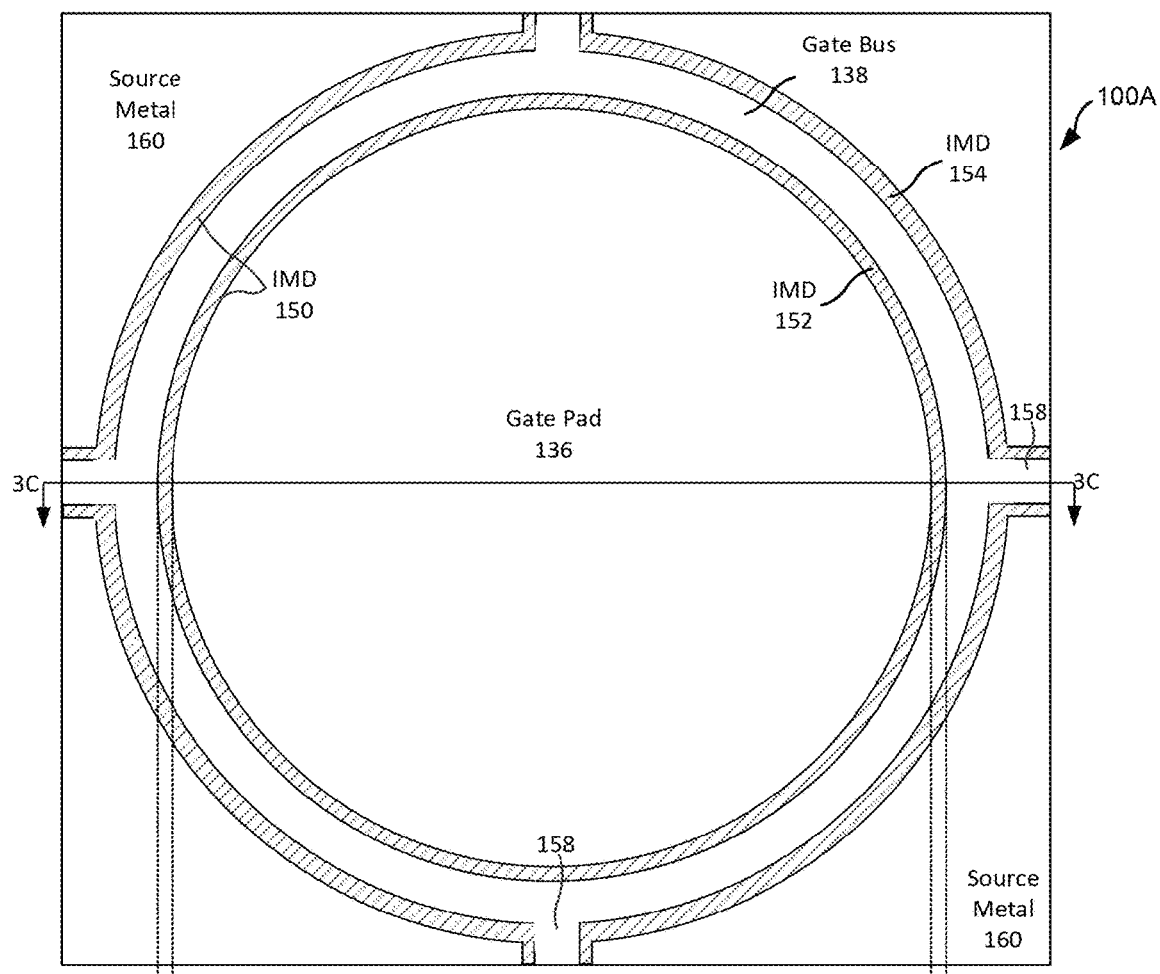
FIG. 3B is an enlarged schematic horizontal cross-sectional view of the region "B" of the power MOSFET of FIG. 3A, where the cross-section is taken just underneath the gate bond pad.
Figure 3C:
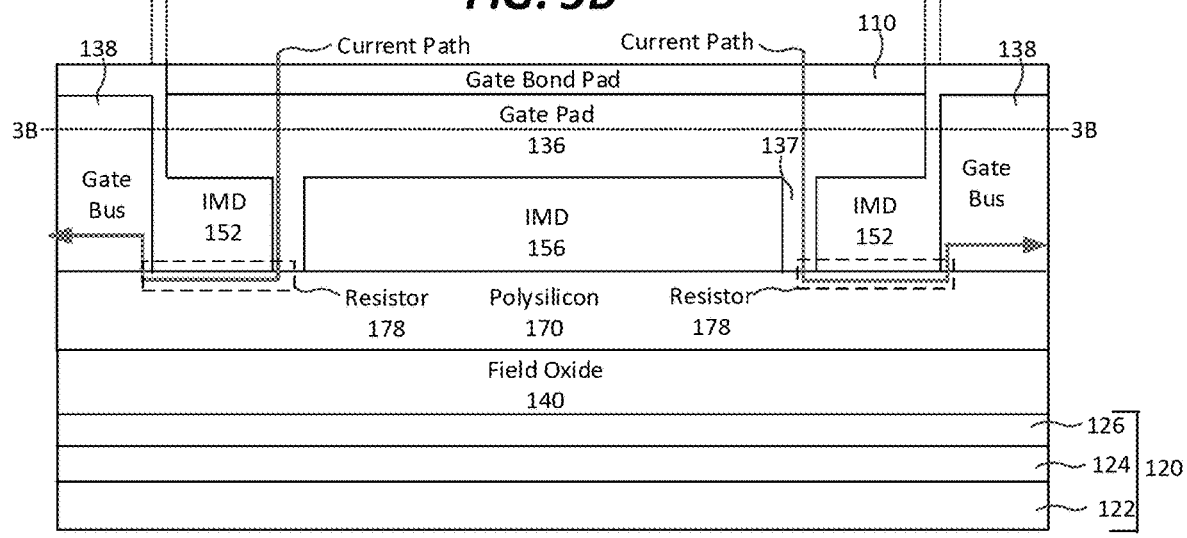
FIG. 3C is a schematic vertical cross-section taken along line 3C-3C of FIG. 3B.
Figures 3D, 3E:
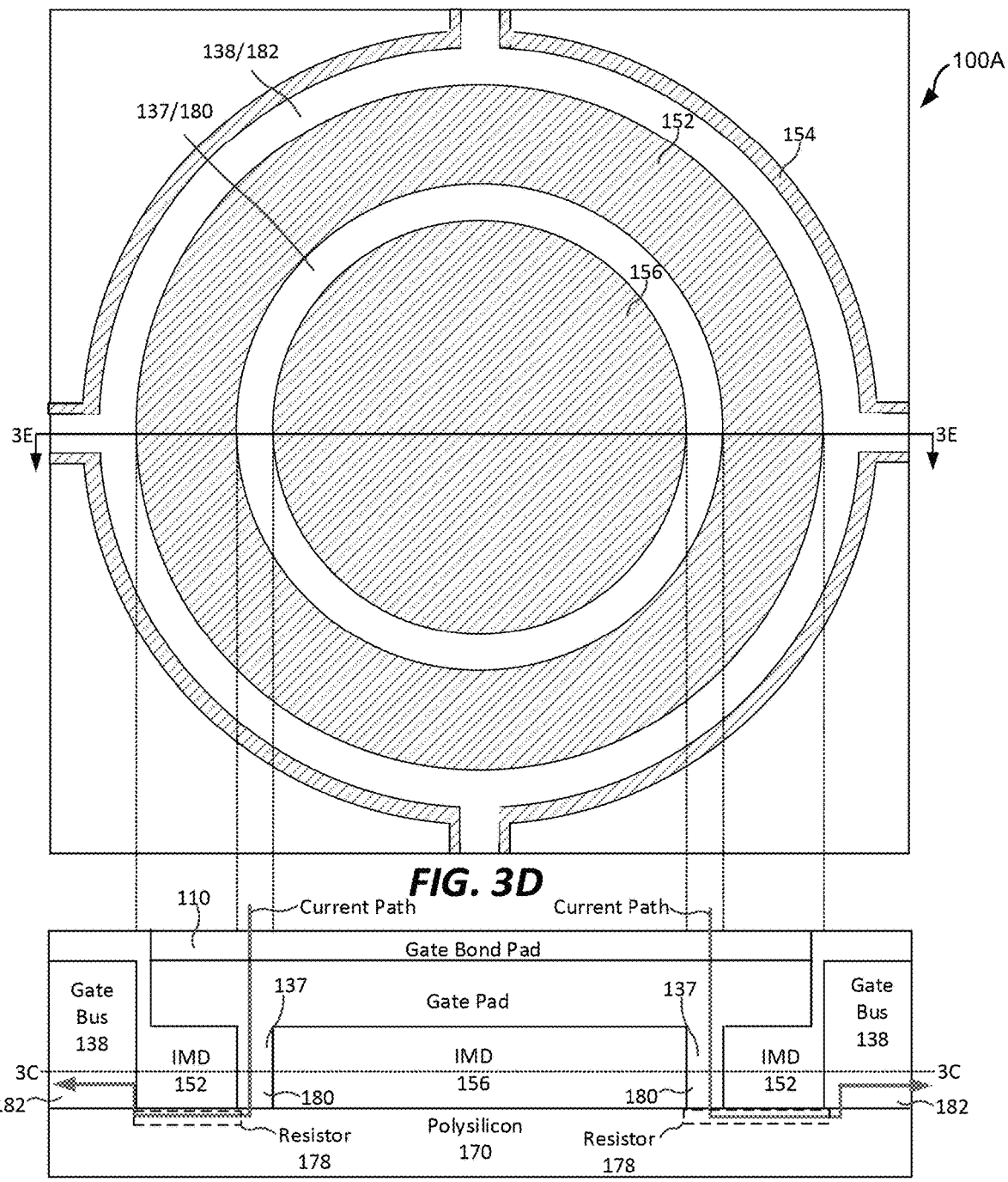
FIG. 3D is a schematic horizontal cross-sectional view of the region "B" of the power MOSFET of FIG. 3A where the cross-section is taken at the level of an inter-metal dielectric layer that is underneath the gate pad.
FIG. 3E is a schematic vertical cross-section taken along line 3E-3E of FIG. 3D.
Figure 3F:
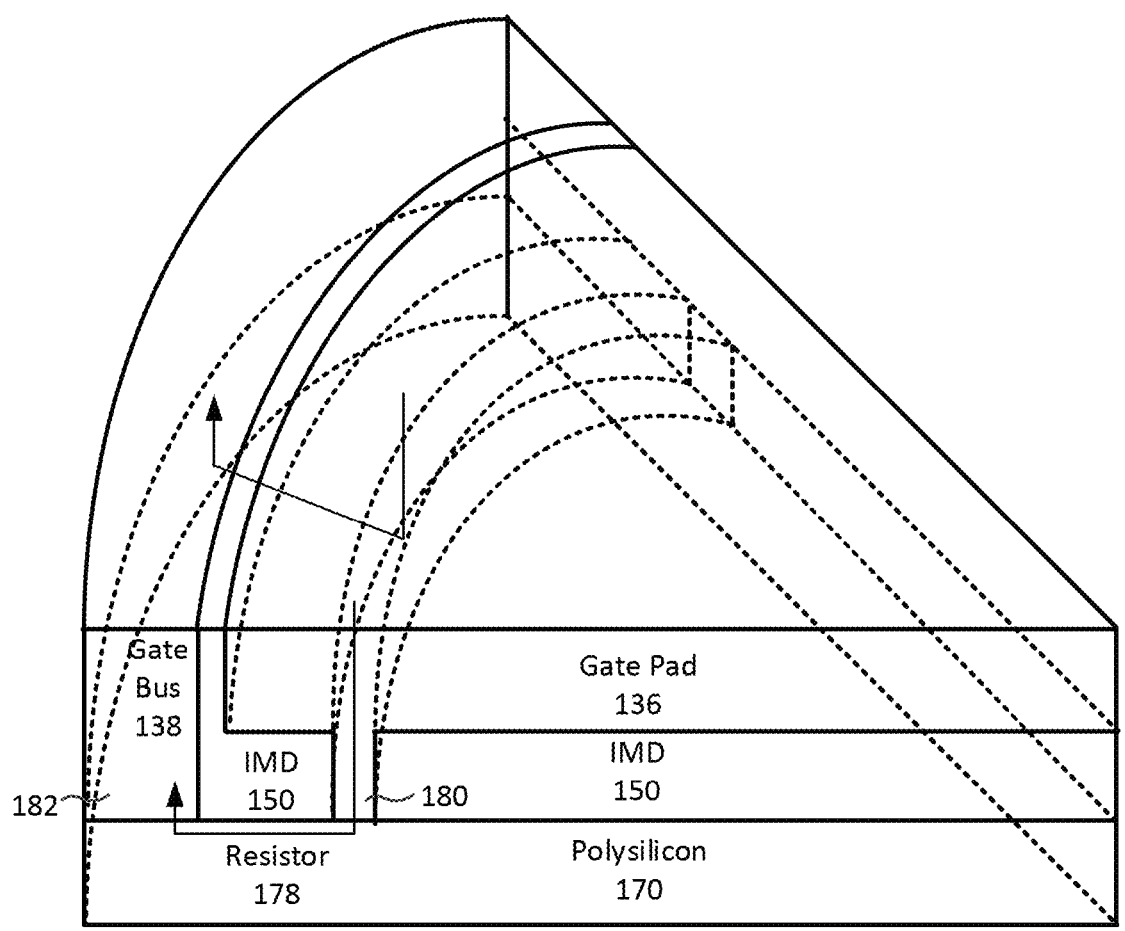
FIG. 3F is a schematic perspective view of several of the layers of the MOSFET of FIG. 3A.

Pursuant to embodiments of the present invention, semiconductor devices having lumped gate resistors that have lower resistance variations are provided. FIGS. 3A-3F illustrate a MOSFET 100A according to an embodiment of the present invention that includes such a lumped gate resistor. In particular, FIG. 3A is a schematic plan view of the power MOSFET 100A. FIG. 3B is an enlarged schematic horizontal cross-sectional view of the region of power MOSFET labeled "B" in FIG. 3A, where the cross-section is taken just underneath the gate bond pad 110. FIG. 3C is a schematic vertical cross-section of the power MOSFET 100A of FIG. 3B where the cross-section is taken along line 3C-3C of FIG. 3B. FIG. 3D is a schematic horizontal cross-sectional view of the region "B" of the power MOSFET of FIG. 3A where the cross-section is taken at the level of an inter-metal dielectric layer that is underneath the gate pad. FIG. 3E is a schematic vertical cross-section of the power MOSFET 100A of FIG. 3D where the cross-section is taken along line 3E-3E of FIG. 3D. FIG. 3F is a schematic perspective view of several of the upper layers of region "B" of MOSFET 100A of FIG. 3A.

As shown in FIG. 3A, the power MOSFET 100A includes a gate bond pad 110 and a pair of source bond pads 112-1, 112-2 that are exposed at the upper surface of the device. An inter-metal dielectric pattern 150 (FIGS. 3B-3F) is interposed between the gate bond pad 110 and the source bond pads 112-1, 112-2 to provide electrical isolation therebetween. A passivation layer 116 covers the inter-metal dielectric pattern 150 and the remainder of the gate and source metal at the top side of the MOSFET 100A.

FIG. 3B is a schematic horizontal cross-sectional view of the portion of FIG. 3A labeled "B", where the cross-section is taken just below the gate bond pad 110. As shown in FIG. 3B, a gate pad 136 is provided underneath the gate bond pad 110. The gate pad 136 may be formed of metal. The gate pad 136 and the gate bond pad 110 may comprise a monolithic metal layer in some embodiments. A circular gate bus 138 surrounds the gate pad 136. An inner ring 152 of the inter-metal dielectric pattern 150 separates the gate pad 136 from the circular gate bus 138. Additional gate buses 138 extend radially from the circular gate bus 138 to carry the gate signal throughout the active area of MOSFET 100A. In the depicted embodiment, four such additional gate buses 138 are visible, and are separated from each other by about 90 degrees. Only a small portion of each additional gate bus 138 is visible in the horizontal cross-sectional view of FIG. 3B. An outer ring 154 of the inter-metal dielectric pattern 150 separates the circular gate bus 138 from the source metallization 160. The outer ring 154 includes openings 158 so that each additional gate bus 138 can physically and electrically connect to the circular gate bus 138.

FIG. 3C is a schematic vertical cross-section taken along line 3C-3C of FIG. 3B. The line 3B-3B in FIG. 3C illustrates the level of the MOSFET 100A where the horizontal cross-section of FIG. 3B is taken in FIG. 3C.

As shown in FIG. 3C, the MOSFET 100A includes a semiconductor layer structure 120. The semiconductor layer structure 120 includes a substrate 122 (e.g., a silicon carbide semiconductor substrate 122), a drift region 124 that is formed on an upper surface of the substrate 122, and a well region 126 that is provided in an upper portion of the drift region 124. The substrate 122, drift region 124 and well region 126 are stacked along a vertical direction. A drain pad (not shown) may be provided on the lower surface of the substrate 122. While not shown in FIG. 3C, the semiconductor layer structure 120 may further include channel regions 127 that are defined in sides of the well regions 126 and source regions 128 that are formed in upper portions of the well region 126. The channel regions 127 and the source regions 128 may only be formed in the active area of the MOSFET 100A, and hence are not visible in FIG. 3C, as the cross-section of FIG. 3C depicts an "inactive" portion of the device underneath the gate pad 136 that does not include unit cell transistors. The active area of MOSFET 100A may have the conventional design shown in the cross-sectional view of FIG. 1C. Moreover, the substrate 122, the drift region 124 and the well region 126 may be comprise the same materials as the corresponding substrate 22, drift region 24 and well region 26 of FIG. 1C.

As is further shown in FIG. 3C, a field oxide layer 140 such as a thick silicon oxide layer is formed on the upper surface of the semiconductor layer structure 120. A polysilicon layer 170 is formed on the field oxide layer 140. The polysilicon layer 170 may be part of a monolithic layer that is used to form gate fingers of MOSFET 100A (not shown in the figures, but corresponding to gate fingers 34 in FIG. 1C). The polysilicon layer 170 may also be referred to herein as the gate resistor layer as a gate resistor may be formed in the polysilicon layer 170.

The polysilicon layer 170 may be a doped polysilicon layer 170. The doped polysilicon layer 170 may be formed in any appropriate fashion. For example, in some embodiments, the doped polysilicon layer 170 may be formed by deposition (e.g., in a low pressure chemical vapor deposition furnace, as is known in the art). In other embodiments, the polysilicon layer 170 may be deposited as an undoped polysilicon layer 170 and may then be doped via ion implantation. In still other embodiments, the polysilicon layer 170 may be deposited as an undoped polysilicon layer 170 and may then be doped via diffusion. Doping polysilicon layer 170 during deposition may provide the simplest manufacturing process, and hence may be preferred for some applications. Doping the polysilicon layer 170 by ion implantation may act to break up the silicon crystals into smaller crystalline units. This may improve the uniformity of the doping profile and provide the most uniform resistance for any gate resistors formed within the polysilicon layer 170. Relatively heavy dopants such as boron difluoride may be implanted into the polysilicon layer 170 in order to ensure that the implantation process breaks the polycrystalline structure into smaller crystal units. An additional implant of other dopant species (e.g., nitrogen) may also be performed to further increase the uniformity of the doping profile, which helps ensure more consistent resistance values.

It will also be appreciated that the gate resistor layer may be formed of materials other than polysilicon. It should be noted that the semiconductor layer structure 120 and field oxide layer 140 will be present in all of the vertical cross-sectional views included with the present application. In order to simplify the remaining drawings, these layers of the MOSFET 100A (and the other MOSFETs depicted herein) are not shown, but it will be appreciated that these layers may be present. It will also be appreciated that the thicknesses of the various layers and patterns in FIG. 3C (and the other vertical cross-sectional views) are not drawn to scale.

Still referring to FIG. 3C, the inter-metal dielectric pattern 150 is formed on the polysilicon layer 170. The gate pad 136 includes a downwardly extending inner contact 137 that penetrates the inter-metal dielectric pattern 150 to contact the polysilicon layer 170. The downwardly extending contact portion 137 separates a central portion 156 of the inter-metal dielectric pattern 150 from a portion of the inter-metal dielectric pattern 150 that includes the inner ring 152. The central portion 156 of the inter-metal dielectric pattern 150 is interposed vertically between the gate pad 136 and the polysilicon layer 170. The central portion 156 of the inter-metal dielectric pattern 150 may have a circular shape when viewed from above (in plan view). The inner contact 137 of the gate pad 136 may be ring-shaped in some embodiments (i.e., has an annular horizontal cross-section). The inter-metal dielectric pattern 150 extends to the upper surface of MOSFET 100A in order to physically and electrically separate the gate pad 136 and gate bond pad 110 from the source metallization structure 160 and the source bond pads 112 (the portion of the inter-metal dielectric pattern 150 that extends to the upper surface of the device is covered by the passivation layer 116 in hence is not visible in FIG. 3A).

FIG. 3D is another schematic horizontal cross-sectional view of the region "B" of the power MOSFET 100A of FIG. 3A. The cross-section is taken at a lower level of the MOSFET 100A than the horizontal cross-section of FIG. 3B; namely the horizontal cross-section of FIG. 3D is taken just above the polysilicon layer 170. FIG. 3E is a schematic vertical cross-section taken along line 3E-3E of FIG. 3D. The vertical cross-section of FIG. 3E is identical to the vertical cross-section of FIG. 3C since the cross-sections are taken along the same "cut" line of the region B of MOSFET 100A. FIG. 3E is provided as the dotted lines extending between FIGS. 3D and 3E help visualize the correspondence between the regions in the horizontal and vertical cross-sectional views.

Referring to FIGS. 3B-3E, it can be seen that the lower portion of the inner ring 152 of the inter-metal dielectric pattern 150 that is illustrated in FIG. 3D is wider than an upper portion of the inner ring 152 of the inter-metal dielectric pattern 150 that is illustrated in FIG. 3B. The lower portion of the inner ring 152 of the inter-metal dielectric pattern 150 defines a lumped gate resistor 178 in the polysilicon layer 170. The width of the lower portion of the inner ring 152 of the inter-metal dielectric pattern 150 may be selected so that the lumped gate resistor 178 may have a desired resistance value.

As shown in FIGS. 3C and 3E, the lumped gate resistor 178 comprises the portion of the polysilicon layer 170 that is directly underneath the lower portion of the inner ring 152 of the inter-metal dielectric pattern 150 that is shown in FIGS. 3D-3E. Since the lower portion of the inner ring 152 of the inter-metal dielectric pattern 150 has a ring shape, the lumped gate resistor likewise has a ring shape. The inner contact 137 of the gate pad 136 acts as an inner contact 180 that physically and electrically connects to the lumped gate resistor 178. The lower portion of the circular gate bus 138 acts as an outer contact 182 the that physically and electrically connects to the lumped gate resistor 178. In the embodiment of FIGS. 3A-3F, the inner contact 180 has an annular shape and hence has a curved outer sidewall having a constant radius. Likewise, the outer contact 182 has an annular shape and thus has a curved inner sidewall having a constant radius. The curved outer sidewall of the inner contact 180 and the curved inner sidewall of the outer contact 182 also define the portion of the polysilicon layer 170 that acts as the lumped gate resistor 178. Thus, the lumped gate resistor 178 likewise includes curved inner and outer sidewalls that are substantially aligned with the curved outer sidewall of the inner contact 180 and the curved inner sidewall of the outer contact 182, respectively. The inner ring 152 of the inter-metal dielectric pattern 150 likewise has curved inner and outer sidewalls. The inner contact 137 and the outer contact 182 may be formed, for example, of materials that make an ohmic contact to the lumped gate resistor 178. For example, if the lumped gate resistor 178 comprises doped polysilicon, the inner and outer contacts 137, 182 may comprise aluminum, titanium or titanium nitride in example embodiments.

As shown in FIGS. 3C and 3E, when a gate signal is applied to the gate bond pad 110, the gate signal passes to the gate pad 136 and then through the inner contact 137/180 to the polysilicon layer 170. Since the widened lower portion of the inner ring 152 of the inter-metal dielectric pattern 150 is interposed between the gate pad 136 and the circular gate bus 138, the only current path between the gate pad 136 and the circular gate bus 138 is through the portion of the polysilicon layer 170 that acts as the lumped gate resistor 178. Since the metal gate pad 136 and the metal gate bus 138 have much lower resistance values than the lumped gate resistor 178 (which is formed in polysilicon), the gate signal will only tend to flow through the portion of the polysilicon layer 170 that is directly under the inner ring 152 of the inter-metal dielectric pattern 150. The gate current will primarily flow at or near the upper surface of the polysilicon layer 170 and will exit the polysilicon layer 70 as soon as the current can flow into the outer contact/gate bus 138/180. In other words, the gate current will enter the polysilicon layer 170 directly adjacent the lower edge of the inner sidewall of the inner ring 152 of the inter-metal dielectric pattern 150, and will exit the polysilicon layer 170 and enter into the circular gate bus 138 directly adjacent the lower edge of the outer sidewall of the inner ring 152 of the inter-metal dielectric pattern 150. This is schematically shown in FIGS. 3C and 3E by the arrows labelled "current path."

The lower portion of the inner ring 152 of the inter-metal dielectric pattern 150 defines the shape of the lumped gate resistor. In other words, the lumped gate resistor has substantially the same horizontal cross-section as does the lower portion of the inner ring 152 of the inter-metal dielectric pattern 150. As shown in FIG. 3E, this closed shape may be an annular ring (or, more generally, an elliptical ring) in some embodiments.

FIG. 3F is a schematic perspective view of several of the upper layers of the MOSFET 100A of FIG. 3A. FIG. 3F illustrates how the widened lower portion of the inner ring 152 of the inter-metal dielectric pattern 150 defines the gate resistor 178 in the polysilicon layer 170. As shown in FIG. 3F, the lower portion of the inner ring 152 of the inter-metal dielectric pattern 150 blocks the direct current path between the gate pad 136 and the circular gate bus 138, thereby forcing the gate current to flow in the polysilicon layer 170 in order to reach the circular gate bus 138. The shape of the lower portion of the inner ring 152 of the inter-metal dielectric pattern 150 defines a lumped gate resistor 178 in the polysilicon layer 170 that has a corresponding shape to the lower portion of the inner ring 152 of the inter-metal dielectric pattern 150 (in this case, an annular shape). The resistance value of the lumped gate resistor 178 may be set by varying the width of the lower portion of the inner ring 152 of the inter-metal dielectric pattern 150.

Referring again to FIG. 3A, the MOSFET 100 has an active area 102 and an inactive area 104 that are defined in the semiconductor layer structure 120. The active area 102 comprises the portion of the semiconductor layer structure 120 in which the unit cell transistors are defined. The inactive region 104 may comprise the remainder of the semiconductor layer structure 120, such as the portion of the semiconductor layer structure 120 underneath the gate bond pad 110 as well as other regions of the device such as termination regions (not shown) that may surround the active region 102. As can be seen in FIG. 3F, the polysilicon layer 170 is provided on an upper side of the semiconductor layer structure 120, and the inner contact 180 and the outer contact 182 are both formed directly on the upper side of the polysilicon layer 170. The outer contact 182 encloses the inner contact 180 within the inactive gate pad area of the MOSFET 100A. An inner dielectric pattern 152 may be provided directly on the upper side of the polysilicon layer 170 in between the inner contact 180 and the outer contact 182. The lumped gate resistor 178 is defined in the polysilicon layer 170 directly underneath the inner dielectric pattern 152.

The outer contact 182 encloses the inner contact 180 within an inactive area of the MOSFET 100A (here within the gate pad region of the device). A resistance value of the lumped gate resistor 178 may only depend on the width of the gap between the inner and outer contacts 180, 182 and the sheet resistance of the material in which the lumped gate resistor 178 is formed (polysilicon in this example, although other materials may be used). In particular, the resistance value R of lumped gate resistor 178 may be determined as follows:

$$R = Rsh/[2\pi * \ln(R2/R1)]$$

In the above equation, Rsh is the sheet resistance of the material used to form the lumped gate resistor 178, R1 is the outer radius of the inner contact 180 and R2 is the inner radius of the outer contact 182. Since the resistance of the lumped gate resistor 178 is only dependent on one parameter that is impacted by manufacturing tolerances (namely the width of the gap R2/R1), the resistor 178 may exhibit less variation in resistance due to manufacturing tolerances.

Additional embodiments of the present invention are discussed below with reference to FIGS. 4A-10. In these figures and the accompanying description, the same reference numerals will be used to discuss the same elements that are described above with reference to FIGS. 3A-3F, even though the shape and/or configuration of some of these elements will vary in the embodiments of FIGS. 4A-10 from what is shown in FIGS. 3A-3F.

Figure 4A:
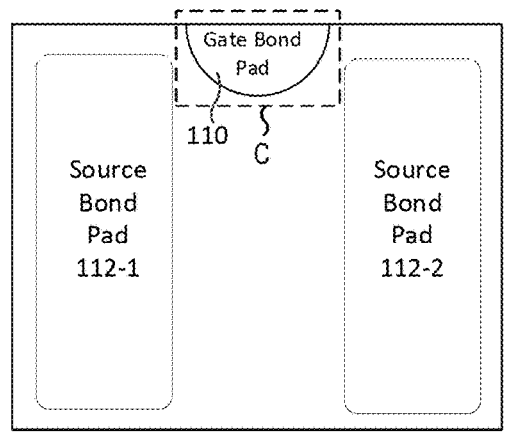
FIG. 4A is a schematic plan view of a power MOSFET according to further embodiments of the present invention.
Figure 4B:
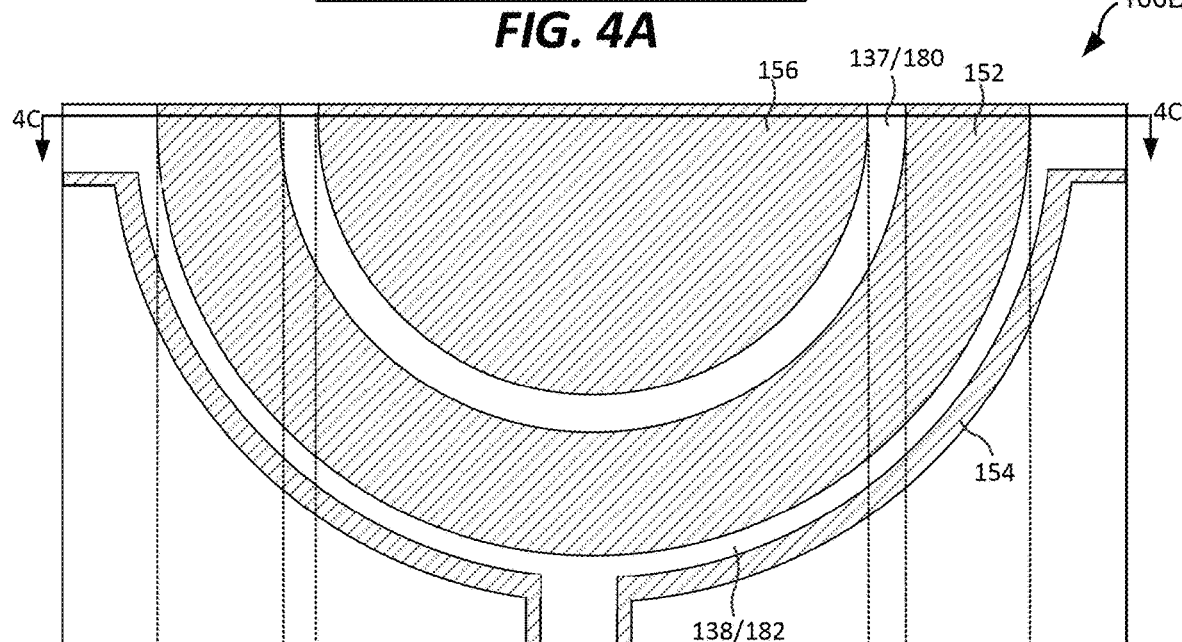
FIG. 4B is a schematic horizontal cross-sectional view of the region "C" of the power MOSFET of FIG. 4A where the cross-section is taken at the level of an inter-metal dielectric layer that is underneath the gate pad.
Figure 4C:
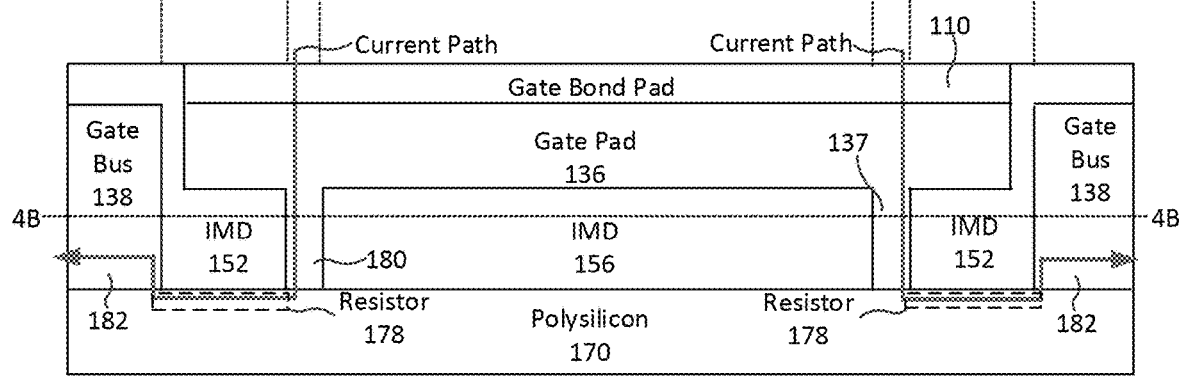
FIG. 4C is a schematic vertical cross-section taken along line 4C-4C of FIG. 4B.

FIGS. 4A-4C schematically illustrate a power MOSFET 100B according to further embodiments of the present invention. In particular, FIG. 4A is a schematic plan view of a power MOSFET 100B, FIG. 4B is a schematic horizontal cross-sectional view of the region of power MOSFET labeled "C" in FIG. 4A where the cross-section is taken at the level within the device that is just above a polysilicon layer that is underneath the gate pad, and FIG. 4C is a schematic vertical cross-section taken along line 4C-4C of FIG. 4B. The cross-sections of FIGS. 4B and 4C correspond to the cross-sections of FIGS. 3D and 3E for MOSFET 100A.

The MOSFET 100B may be nearly identical to the MOSFET 100A of FIGS. 3A-3F, with the primary difference being that the gate bond pad 110 is formed at or near an edge of the device as opposed to being formed in a central region of the device (i.e., away from the edge) as was the case with MOSFET 100A. When the gate bond pad 136 is formed near an edge of the device, the circular gate resistor 178 of MOSFET 100A may be replaced by a gate resistor 178 that has, for example, a semicircular ring shape. In particular, as shown in FIGS. 4B and 4C, the lower portion of the inner ring 152 of the inter-metal dielectric pattern 150 has a semicircular ring shape (when viewed from above) in order to define the gate resistor 178 having a semicircular ring shape in the polysilicon layer 170. The gate pad 136, the inner contact 180, the outer contact 182 (which is the lower portion of the gate bus 138), and the gate bus 138 each also has a semicircular ring shape when viewed from above (in plan view).

The resistance value of the lumped gate resistor 178 depends on the width of the gap between the inner and outer contacts 180, 182 and the sheet resistance of the material in which the lumped gate resistor 178 is formed. In particular, the resistance value R of lumped gate resistor 178 may be determined as follows:

$$R=[2*Rsh]/[2\pi*\ln(R2/R1)]$$

Thus, the gate resistor 178 may be less susceptible to variation due to manufacturing tolerances than the conventional lumped gate resistor 78 that is described above with reference to FIGS. 2A-2H.

As discussed above, the lower portion of the inner ring 152 of the inter-metal dielectric pattern 150 defines the shape of the top surface of the lumped gate resistor 178. As shown in FIG. 4B, a first end of the lower portion of the inner ring 152 of the inter-metal dielectric pattern 150 extends to an edge of MOSFET 100B and an opposed second end of the lower portion of the inner ring 152 of the inter-metal dielectric pattern 150 also extends to the same edge of MOSFET 100B. Consequently, a first end and an opposed second end of the lumped gate resistor 178 each extend to a periphery of the MOSFET 100B and, more particularly to a common edge of the MOSFET 100B. As can also be seen from FIGS. 4B and 4C, the outer contact 182 encloses the inner contact 180 within the inactive gate pad region of MOSFET 100B. In this embodiment, the outer contact 182 does not fully surround the inner contact 180 as was the case with MOSFET 100A, and instead the outer contact 182 encloses the inner contact 180 within the inactive gate pad area by extending to the edge of the device so that the outer contact 182 and the edge of the device surround the inner contact 180. As discussed above, the term "enclosed" is used to mean that the outer contact (possibly in combination with edges of the device) surround the inner contact in a horizontal cross-section through the device. Thus, it will be appreciated that references to the outer contact enclosing or surrounding the inner contact refer to enclosing or surrounding the inner contact in two dimensions, as opposed to enclosing or surrounding the inner contact in all three dimensions.

Figure 5A:
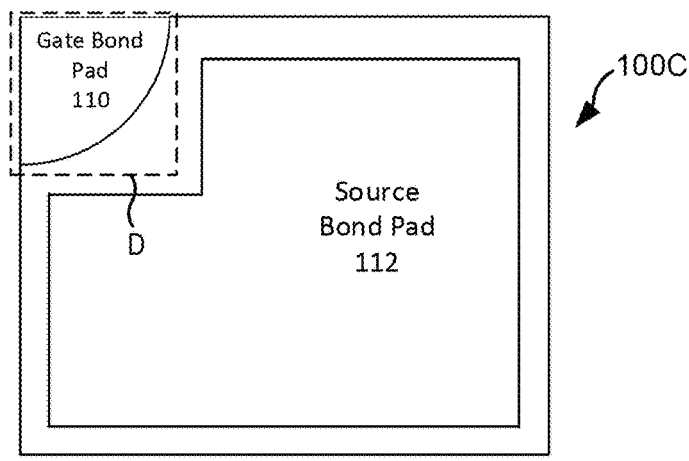
FIG. 5A is a schematic plan view of a power MOSFET according to further embodiments of the present invention.
Figure 5B:
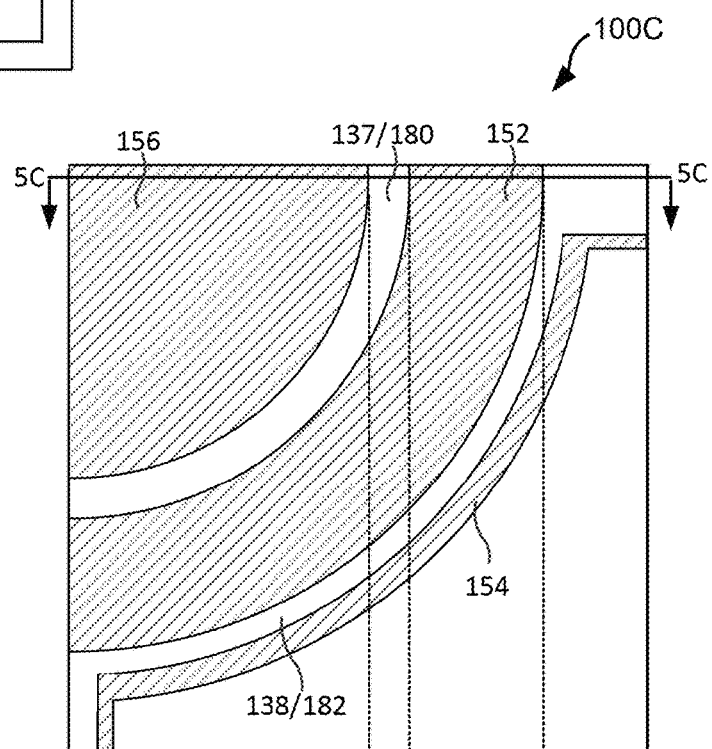
FIG. 5B is a schematic horizontal cross-sectional view of the region "D" of the power MOSFET of FIG. 5A where the cross-section is taken at the level of an inter-metal dielectric layer that is underneath the gate pad.
Figure 5C:
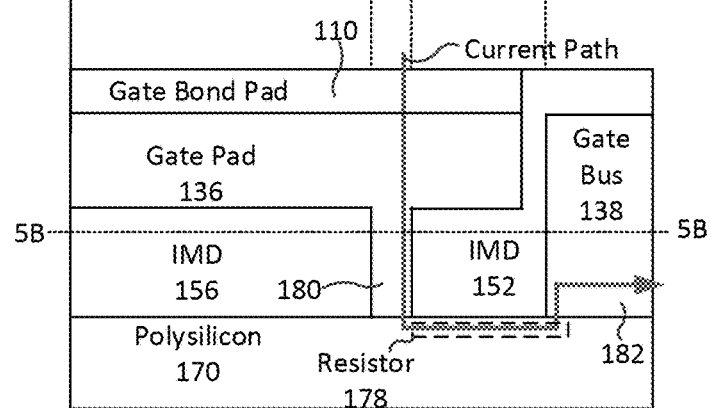
FIG. 5C is a schematic vertical cross-section taken along line 5C-5C of FIG. 5B.

FIGS. 5A-5C schematically illustrate a power MOSFET 100C according to still further embodiments of the present invention. In particular, FIG. 5A is a schematic plan view of the power MOSFET 100C, FIG. 5B is a schematic horizontal cross-sectional view of the region of power MOSFET labeled "D" in FIG. 5A where the cross-section is taken at the level of an inter-metal dielectric layer that is underneath the gate pad, and FIG. 5C is a schematic vertical cross-section taken along line 5C-5C of FIG. 5B. The cross-sections of FIGS. 5B and 5C correspond to the cross-sections of FIGS. 3D and 3E for MOSFET 100A.

MOSFET 100C may be nearly identical to the MOSFET 100A of FIGS. 3A-3F, with the primary difference being that the gate bond pad 110 is formed in a corner of the device as opposed to being formed in a central region of the device (i.e., away from the edge) as was the case with MOSFET 100A. When the gate bond pad is formed in a corner of the device, the circular gate resistor 178 of MOSFET 100A may be replaced by a gate resistor 178 that has a quarter-circular ring shape when viewed from above. In particular, as shown in FIGS. 5B and 5C, the lower portion of the inner ring 152 of the inter-metal dielectric pattern 150 extends through approximately one quarter of a circle in order to define the gate resistor 178 that comprises approximately one-quarter of an annular ring in the polysilicon layer 170. The gate pad 136, the inner contact 180, the outer contact 182 (which is the lower portion of the gate bus 138), and the gate bus 138 each also have a shape of one quarter of a circular ring when viewed from above (in plan view).

The resistance value of the lumped gate resistor 178 depends on the width of the gap between the inner and outer contacts 180, 182 and the sheet resistance of the material in which the lumped gate resistor 178 is formed, and hence may be less susceptible to variation due to manufacturing tolerances than conventional lumped gate resistors. In particular, the resistance value R of lumped gate resistor 178 may be determined as follows:

$$R=[4*Rsh]/[2\pi*\ln(R2/R1)]$$

A first end of the lower portion of the inner ring 152 of the inter-metal dielectric pattern 150 extends to a first edge of MOSFET 100C and a second end of the lower portion of the inner ring 152 of the inter-metal dielectric pattern 150 extends to a second edge of MOSFET 100B. The second edge is adjacent the first edge. As such, the first and second ends of the lumped gate resistor 178 each extend to a periphery of the MOSFET 100C. The outer contact 182 again encloses the inner contact 180 within the inactive gate pad region of MOSFET 100C.

Figures 6A, 6B:
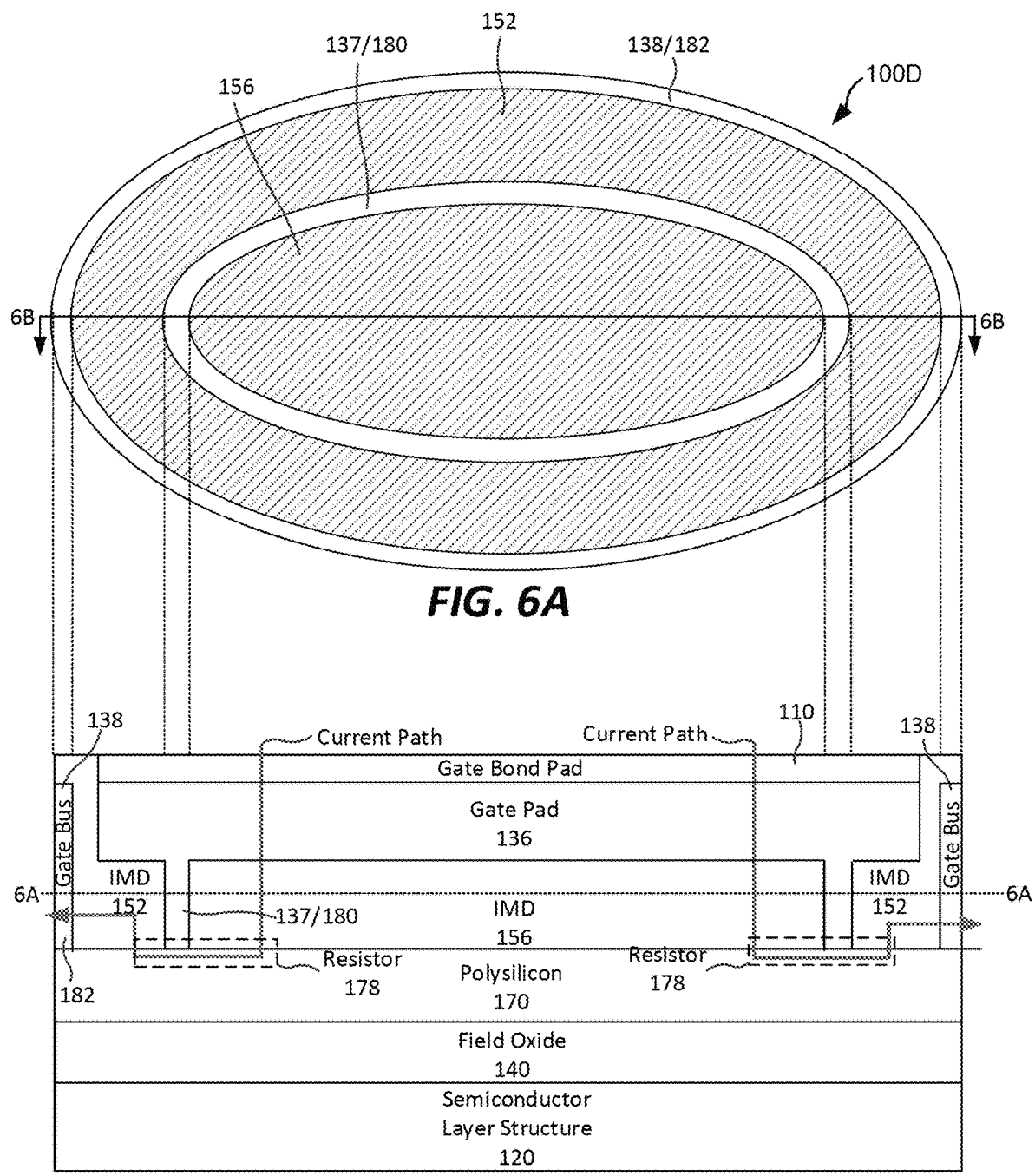
FIG. 6A is a schematic horizontal cross-sectional view of a power MOSFET according to embodiments of the present invention that has a lumped gate resistor that has a non-circular elliptical ring shape.
FIG. 6B is a vertical cross section taken along line 6B-6B of FIG. 6A.

It will be appreciated that the lumped gate resistors according to embodiments of the present invention may have shapes other than circular ring shapes. For example, as discussed above, in some embodiments the lumped gate resistors may have elliptical ring shapes when viewed from above. FIGS. 6A-6B illustrate a MOSFET 100D that is similar to the MOSFET 100A of FIGS. 3A-3F, except that the lumped gate resistor 178 has a non-circular elliptical ring shape as opposed to the annular ring shape of the resistor 178 of MOSFET 100A. FIG. 6A is a schematic horizontal cross-sectional view of power MOSFET 100D that corresponds to the horizontal cross-section FIG. 3D of MOSFET 100A. FIG. 6B is a vertical cross section taken along line 6B-6B of FIG. 6A.

Referring to FIGS. 6A-6B, it can be seen that the MOSFET 100D may be identical to MOSFET 100A, except that the gate bus 138 (including the lower portion thereof that acts as the outer contact 182), the inner ring 152 of inter-metal dielectric pattern 150, the inner contact 137 of gate pad 136 (that acts as the inner contact 180) and the lumped gate resistor 178 are all formed to have elliptical ring shapes when viewed from above (or in horizontal cross-section), where the major and minor axes of the ellipses are not equal (i.e., the elliptical ring is not an annular ring). The width of the lower surface of the inner ring 152 of inter-metal dielectric pattern 150 is constant in MOSFET 100D. Note that only the circular gate bus 138 is illustrated in FIGS. 6A-6B to simplify the drawings. It will be appreciated that additional gate buses may extend from the circular gate bus 138 throughout the active area of MOSFET 100D in the same manner that such additional gate buses 138 are included in MOSFET 100A of FIGS. 3A-3F.

Moreover, while FIGS. 6A-6B illustrate a MOSFET having a lumped gate resistor 178 that extends through a full elliptical ring (where the major and minor axes of the ellipses defining the ring are not equal), it will be appreciated that embodiments of the invention are not limited thereto. For example, corresponding MOSFETs may be provided that have a lumped gate resistor having a semicircular ring shape (which corresponds to MOSFET 100B where the major and minor axes of the ellipses defining the ring are not equal) or a lumped gate resistor having a quarter-circle ring shape (which corresponds to MOSFET 100C where the major and minor axes of the ellipses defining the ring are not equal).

Figure 7A:
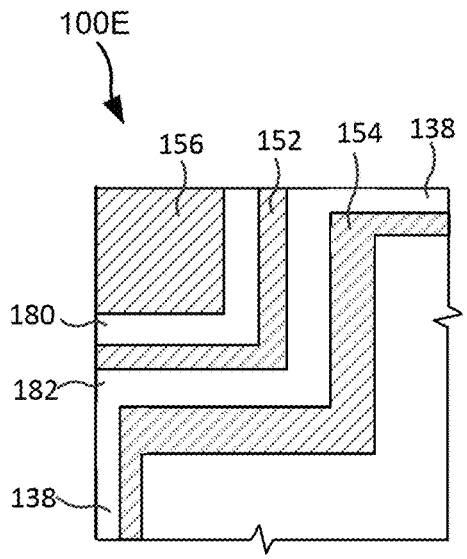
FIGS. 7A-7C are horizontal cross-sectional views of MOSFETs according to further embodiments of the present invention that have lumped gate resistors having shapes that are either partly or fully linear.
Figure 7B:
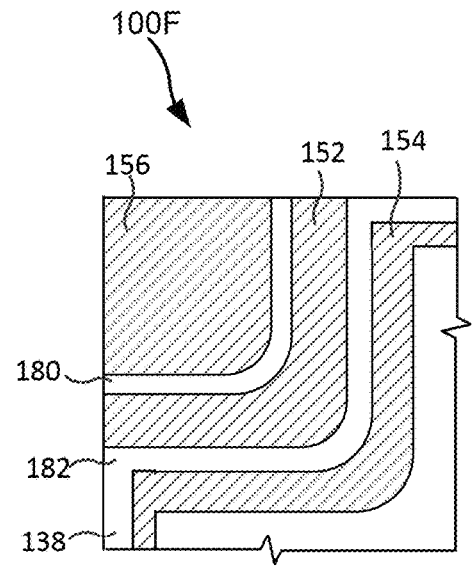
Figure 7C:
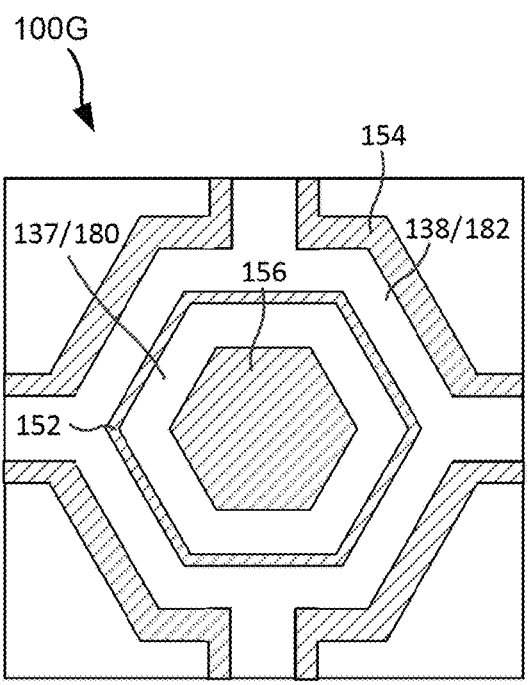

In still further embodiments of the present invention, the lumped gate resistors may have shapes that are either partly or fully linear. FIGS. 7A-7C are horizontal cross-sectional views of MOSFETs according to further embodiments of the present invention that have lumped gate resistors having such shapes. The horizontal cross-sectional views of FIGS. 7A-7C are each taken through the lower portion of the inner ring 152 (or partial ring for devices where the gate pad is formed along an edge or in a corner of the device) of the inter-metal dielectric layer 150. Thus, the cross-sections of FIGS. 7A-7C correspond to the horizontal cross-sections of FIGS. 3D, 4B, 5B and 6A above. The MOSFETs of FIGS. 7A-7C may be identical to a corresponding one of MOSFETs 100A, 100B or 100C (depending on where the gate pad is formed) except for in the design of the lumped gate resistors thereof (as well as the designs of the inner contact 180, the lower portion of the inner ring 152 of the inter-metal dielectric pattern 150 and the outer contact 182) that define the lumped gate resistor 178.

Referring to FIG. 7A, a MOSFET 100E is illustrated in which the lumped gate resistor 178 has a right angle shape. It will be appreciated that the lumped gate resistor 178 is not visible in the cross-section of FIG. 7A, as it is underneath the inner ring 152 of the inter-metal dielectric pattern 150. The shape of the lumped gate resistor 178 of MOSFET 100E will be identical to the shape of the lower portion of the inner ring 152 of the inter-metal dielectric pattern 150. Notably, the lumped gate resistor 178 of MOSFET 100E does not have curved sidewalls. The width of the gap between the inner contact 180 and the outer contact 182 is a constant distance W and hence the width of the lumped gate resistor 178 is also constant. The embodiment of FIG. 7A may be particularly appropriate for MOSFETs where the gate pad 136 is located in a corner of the device.

Referring to FIG. 7B, a MOSFET 100F is illustrated in which the lumped gate resistor 178 has a general "L" shape, but the inner and outer corners of the "L" are rounded. It will be appreciated that the lumped gate resistor 178 is not visible in the cross-section of FIG. 7B, as it is underneath the inner ring 152 of the inter-metal dielectric pattern 150. The width of the gap between the inner contact 180 and the outer contact 182 is again a constant distance W and hence the width of the lumped gate resistor 178 is also constant. The embodiment of FIG. 7B illustrates that the inner contact 180, the outer contact 182, the inner ring 152 of the inter-metal dielectric pattern 150 and the lumped gate resistor 178 may have sidewalls that are combinations of straight and curved surfaces. The embodiment of FIG. 7B may be particularly appropriate for MOSFETs where the gate pad 136 is located in a corner of the device.

Referring to FIG. 7C, a MOSFET 100G is illustrated in which the inner ring 152 of the inter-metal dielectric pattern 150 (and hence the lumped gate resistor 178 thereunder) has hexagonal ring shape when viewed from above. The width of the gap between the inner contact 180 and the outer contact 182 is again a constant distance W and hence the width of the lumped gate resistor 178 is also constant. The embodiment of FIG. 7C may be particularly appropriate for MOSFETs where the gate pad 136 is located in a central region of the device.

Figure 8:
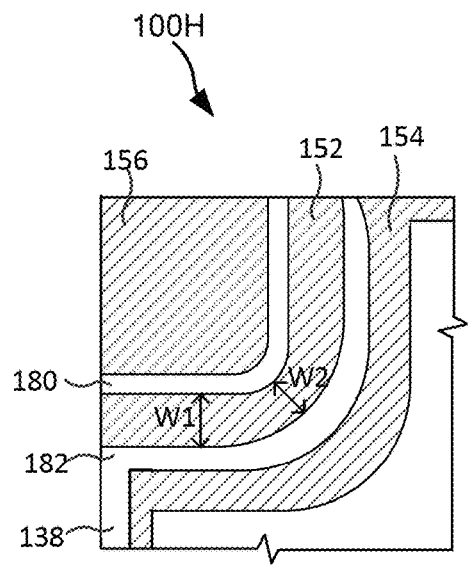
FIG. 8 is a schematic horizontal cross-sectional view of a power MOSFET according to additional embodiments of the present invention that illustrates how the gap between the inner and outer contacts to the lumped gate resistor need not be constant.

It will also be appreciated that the width of the gap between the inner and outer contacts 180, 182 need not be a constant distance. FIG. 8 illustrates an embodiment in which the lower portion of the inner ring 152 of the inter-metal dielectric pattern 150 (and hence the lumped gate resistor 178 thereunder) has a non-constant width. In the embodiment shown in FIG. 8 corresponds to the embodiment of FIG. 7B above, except that in the embodiment of FIG. 8, the distance between the inner and outer contacts 180, 182 is reduced in the "corner" region of the lower portion of the inner ring 152. Reducing the width of the "gap" may result in higher current density flowing through this region. It will be appreciated that all of the above embodiments may be modified to have non-constant gaps between the inner and outer contacts 180, 182 so that the widths of the lumped gate resistors are non-constant.

Figures 9A, 9B:
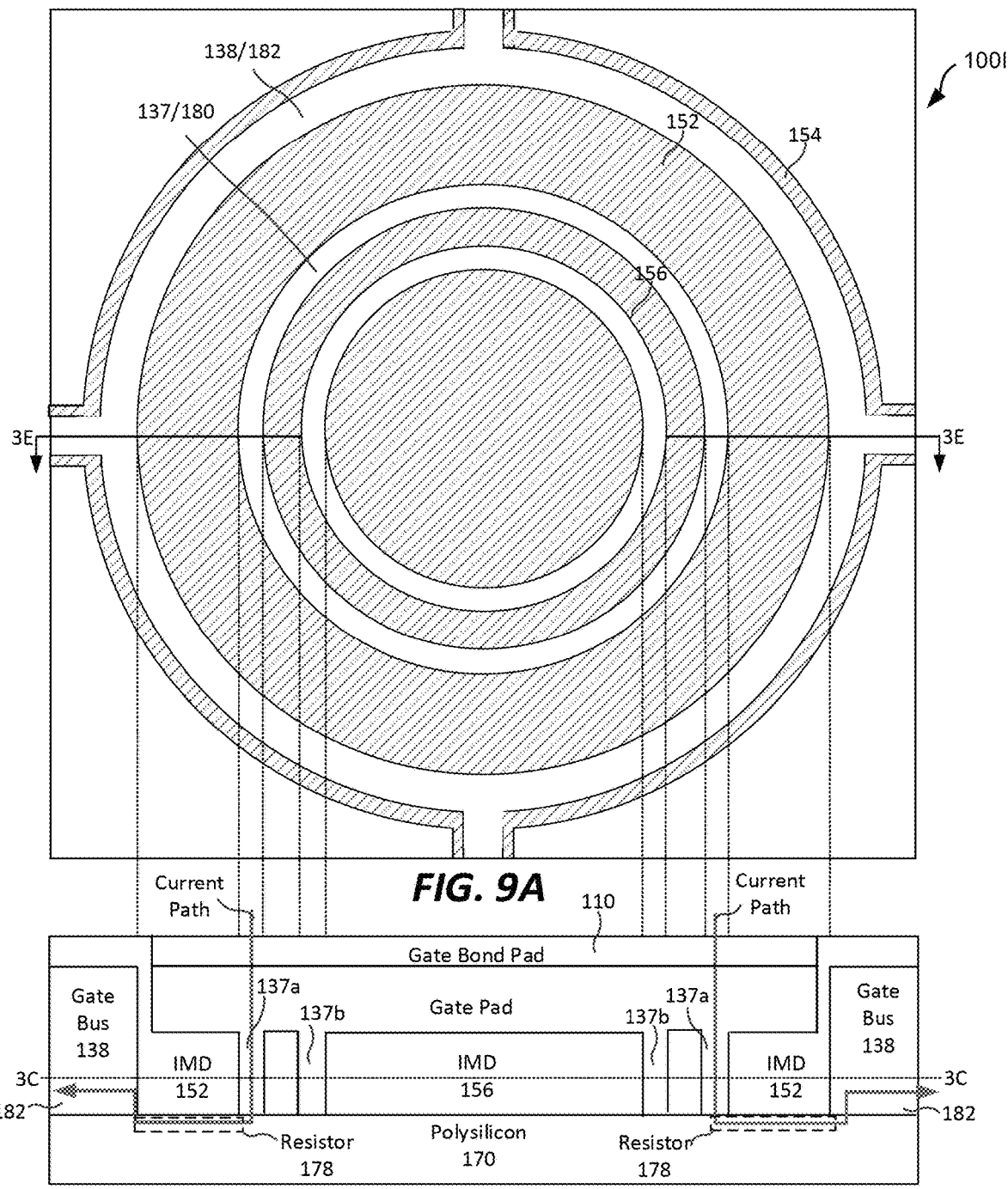
FIGS. 9A and 9B are schematic cross-sectional views corresponding to FIGS. 3D and 3E above, respectively, that illustrate an alternative design for the inner contact to the lumped gate resistor.

FIGS. 9A and 9B are schematic cross-sectional views corresponding to FIGS. 3D and 3E above, respectively, that illustrate a MOSFET 100I according to embodiments of the present invention that has an alternative design for the inner contact to the lumped gate resistor. As shown in FIGS. 9A and 9B, the MOSFET 100I may be identical to the MOSFET 100A of FIGS. 3A-3F except that the annular inner contact 137 of MOSFET 100A is replaced with a pair of spaced apart annular inner contacts 137a, 137b in MOSFET 100I. If the device works correctly, then all of the current will flow through the outer one of the two inner contacts (i.e., inner contact 137a) and the MOSFET 100I will operate identically to MOSFET 100A. However, if the outer inner contact 137a fails for some reason, then the second inner contact 137b will still provide a current path from the gate pad to the gate fingers, allowing the MOSFET 100I to operate. Under these circumstances, the lumped gate resistor 178 will not have an ideal resistance (as their will be a longer current path through the polysilicon layer 170).

Figure 10:
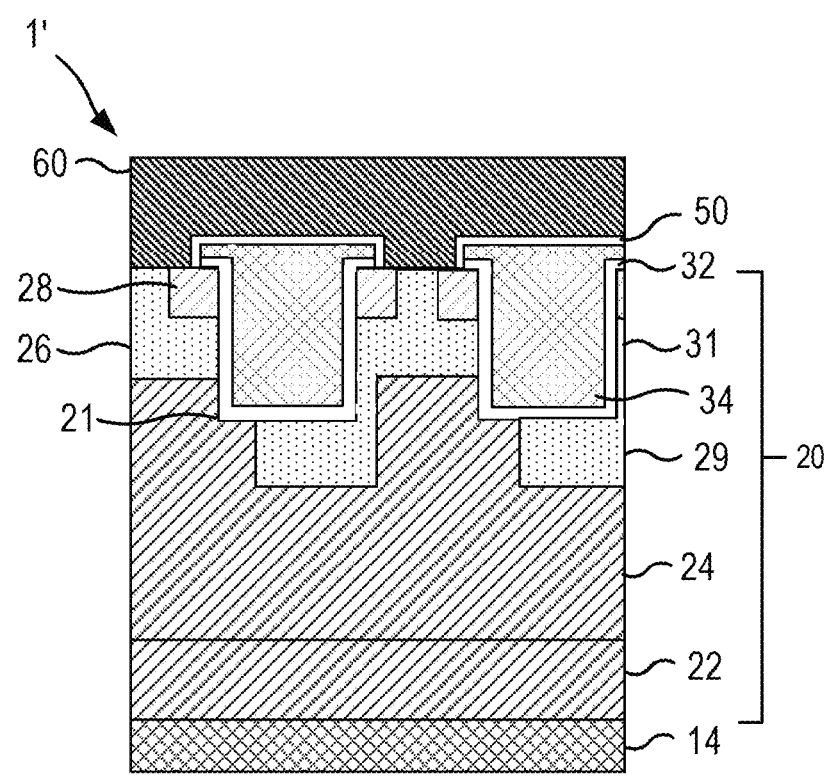
FIG. 10 is a schematic vertical cross-section of a gate trench MOSFET that can include a lumped gate resistor according to embodiments of the present invention.

While the discussion above is primarily focused on planar MOSFETs, it will be appreciated that all of the disclosed embodiments can likewise be used in MOSFETs in which the gate fingers are formed within trenches in the semiconductor layer structure. For example, FIG. 10 is a schematic cross-sectional view of a MOSFET 1' that is a modified version of the conventional MOSFET 1 depicted in FIG. 1C. The MOSFET 1' of FIG. 10 includes gate fingers 34' that are formed in trenches 21 within the semiconductor layer structure 20 as opposed to having planar gate fingers 34 that are formed on the semiconductor layer structure 20. As shown in FIG. 10, the MOSFET 1' may be very similar to the MOSFET 1 of FIG. 1C, except that a plurality of trenches 21 are etched (or otherwise formed) in the semiconductor layer structure 20, and the gate insulating fingers 32 and the gate fingers 34' are then formed in the respective trenches 21. Additionally, p-type shielding regions 29 may be formed beneath all or part of each trench 21 to protect the gate insulating fingers 32 during reverse bias operation, and p-shield connection regions 31 may be provided that electrically connect the p-type shielding regions 29 to the source metallization 60. Thus, it will be appreciated that the gate resistors according to embodiments of the present invention may be implemented in gate-controlled devices that have gate trenches, such as the device of FIG. 10, as well as in devices that have planar gate fingers.

Likewise, while the discussion herein focuses on power MOSFET devices, it will be appreciated that the techniques disclosed herein are not limited to such devices. For example, the techniques disclosed herein may also be used in IGBT devices, JFETs, thyristors, GTOs or any other gate-controlled device.

While the MOSFETs discussed above are n-type devices with the source bond pad on an upper side thereof and the drain pad on the bottom side thereof, it will be appreciated that in p-type devices these locations are reversed. Moreover, while the above-described power MOSFETs and the other devices described herein are shown as being silicon carbide-based semiconductor devices, it will be appreciated that embodiments of the present invention are not limited thereto. Instead, the semiconductor devices may comprise any wide bandgap semiconductor that is suitable for use in power semiconductor devices including, for example, gallium nitride-based semiconductor devices, gallium nitride-based semiconductor devices and II-VI compound semiconductor devices.

As us herein, the term "horizontal cross-section" refers to a cross-section that is taken along a plane that is parallel to a plane defined by the bottom surface of the semiconductor layer structure.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

It will be understood that the embodiments disclosed herein can be combined. Thus, features that are pictured and/or described with respect to a first embodiment may likewise be included in a second embodiment, and vice versa.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A semiconductor device, comprising:
    a semiconductor layer structure comprising an active area with a plurality of unit cell transistors and an inactive gate pad area;
    a lumped gate resistor on an upper side of the semiconductor layer structure;
    an inner contact;
    an outer contact; and
    an inner dielectric pattern that is directly on the upper side of the lumped gate resistor in between the inner contact and the outer contact,
    wherein a sidewall of the inner dielectric pattern includes a combination of straight and curved surfaces.

2. The semiconductor device of claim 1, wherein a horizontal cross-section of the inner dielectric pattern defines at least a portion of an elliptical ring.

3. The semiconductor device of claim 1, wherein a shape of the inner dielectric pattern defines a shape of the lumped gate resistor.

4. The semiconductor device of claim 1, wherein the outer contact surrounds the inner contact when viewed from above.

5. The semiconductor device of claim 1, wherein the outer contact and at least one edge of the semiconductor device surround the inner contact when viewed from above.

6. A semiconductor device, comprising:
a semiconductor layer structure; and
a gate structure that comprises a lumped gate resistor on an upper side of the semiconductor layer structure;
wherein a first end and an opposed second end of the lumped gate resistor each extend to a periphery of the semiconductor device.

7. The semiconductor device of claim 6, wherein the first end extends to a first edge of the semiconductor device and the second end also extends to the first edge of the semiconductor device.

8. The semiconductor device of claim 6, wherein the first end extends to a first edge of the semiconductor device and the second end extends to a second edge of the semiconductor device.

9. The semiconductor device of claim 6, wherein a dielectric pattern that defines a portion of an elliptical ring is positioned directly above the lumped gate resistor.

10. The semiconductor device of claim 6, wherein the gate structure further comprises an outer contact that connects to an outer edge of the lumped gate resistor and an inner contact that connects to an inner edge of the lumped gate resistor.

11. The semiconductor device of claim 10, wherein the lumped gate resistor comprises a first material that has a first sheet resistance and the inner contact and the outer contact each comprise materials that have a sheet resistance that is less than the first sheet resistance.

12. A semiconductor device, comprising:
a semiconductor layer structure that comprises a plurality of semiconductor layers that are stacked along a vertical direction;
a gate structure on an upper side of the semiconductor layer structure, the gate structure comprising a lumped gate resistor; and
a dielectric pattern that is directly on an upper side of the lumped gate resistor,
wherein a horizontal cross-section of the dielectric pattern has a curved inner surface and a curved outer surface.

13. The semiconductor device of claim 12, wherein the curved inner surface and the curved outer surface define at least a portion of an elliptical ring.

14. The semiconductor device of claim 13, wherein the gate structure further includes a gate pad, one or more gate buses and a plurality of gate fingers, and wherein the lumped gate resistor is interposed electrically between the gate pad and the gate fingers.

15. The semiconductor device of claim 14, wherein the gate pad and the one or more gate buses each comprise a metal, and the gate fingers comprise a semiconductor material.

16. The semiconductor device of claim 15, wherein the lumped gate resistor is within a semiconductor layer.

17. The semiconductor device of claim 12, wherein the semiconductor layer structure comprises a plurality of wide bandgap semiconductor layers, and the lumped gate resistor is on the upper side of the wide bandgap semiconductor layer structure and at least partly underneath the gate pad.

18. The semiconductor device of claim 1, wherein, in a horizontal cross section of the semiconductor device, the outer contact encloses the inner contact within the inactive gate pad area of the semiconductor device.

19. The semiconductor device of claim 1, wherein the lumped gate resistor comprises doped polysilicon.

20. The semiconductor device of claim 12, wherein the dielectric pattern forms a closed ring and is located in a central region of the semiconductor device.

21. The semiconductor device of claim 20, wherein the dielectric pattern is positioned between first and second source contacts when viewed from above.

22. The semiconductor device of claim 12, wherein the dielectric pattern forms a semicircle and is located adjacent an edge of the semiconductor device.

23. The semiconductor device of claim 12, wherein the dielectric pattern forms a partial ring that extends from adjacent a first side of the semiconductor device to adjacent a second side of the semiconductor device.

24. A semiconductor device, comprising:
a semiconductor layer structure comprising an active area with a plurality of unit cell transistors and an inactive gate pad area;
an inner contact;
an outer contact;
a lumped gate resistor on an upper side of the semiconductor layer structure that electrically connects the inner contact to the outer contact;
wherein, in a horizontal cross-section of the semiconductor device, the inner contact is located in a center of the semiconductor device when viewed from above and the outer contact encloses the inner contact.

* * * * *

UNITED STATES PATENT AND TRADEMARK OFFICE
CERTIFICATE OF CORRECTION

PATENT NO. : 11,664,436 B2
APPLICATION NO. : 17/188329
DATED : May 30, 2023
INVENTOR(S) : Ryu et al.

Page 1 of 1

It is certified that error appears in the above-identified patent and that said Letters Patent is hereby corrected as shown below:

In the Specification

Column 12, Line 43: Please correct "(n)" to read --(n⁻)--

Column 15, Line 5: Please correct "211" to read --2H--

Signed and Sealed this
Twenty-fifth Day of July, 2023

Katherine Kelly Vidal
*Director of the United States Patent and Trademark Office*